United States Patent
Mueller et al.

(10) Patent No.: US 6,699,329 B2
(45) Date of Patent: Mar. 2, 2004

(54) COATING AND CURING SYSTEM

(75) Inventors: David T. Mueller, Evansville, IN (US);
Edward C. Diekmann, Evansville, IN (US)

(73) Assignee: George Koch Sons, LLC, Evansville, IN (US)

(*) Notice: Subject to any disclaimer, the term of this patent is extended or adjusted under 35 U.S.C. 154(b) by 21 days.

(21) Appl. No.: 10/155,455

(22) Filed: May 24, 2002

(65) Prior Publication Data

US 2003/0005885 A1 Jan. 9, 2003

Related U.S. Application Data

(60) Provisional application No. 60/293,807, filed on May 25, 2001.

(51) Int. Cl.[7] ............................. B05C 3/10; B05C 13/02
(52) U.S. Cl. ........................... 118/641; 118/58; 118/69; 118/326; 118/425; 198/465.4
(58) Field of Search ................... 118/20, 50.1, 620, 118/630, 632, 641–643, 58, 69, 326, 425; 198/465.4; 134/64 R, 122 R; 427/372.2; 204/269

(56) References Cited

U.S. PATENT DOCUMENTS

| | | | | |
|---|---|---|---|---|
| 4,263,122 A | * | 4/1981 | Urquhart | 204/623 |
| 4,668,358 A | * | 5/1987 | Ball | 204/489 |
| 4,942,956 A | | 7/1990 | Acker et al. | 198/465.3 |
| 5,012,918 A | | 5/1991 | Acker et al. | 198/465.4 |

FOREIGN PATENT DOCUMENTS

EP  1 050 495 A2  11/2000

* cited by examiner

*Primary Examiner*—Laura Edwards
(74) *Attorney, Agent, or Firm*—Barnes & Thornburg

(57) ABSTRACT

A conveyor system for parts coupled to a loadbar assembly is disclosed. The conveyor system includes a walking beam conveyor and a push bar conveyor. The loadbar assembly and walking beam conveyor are configured to allow transfer of parts coupled to loadbar assemblies along a path through upward and downward and forward and reverse movements of the walking beam conveyor. The push bar conveyor and the loadbar assembly are configured to urge parts coupled to the loadbar assemblies through the push bar conveyor by an incremental distance substantially equal to the length of a segment bar of the loadbar assembly.

37 Claims, 19 Drawing Sheets

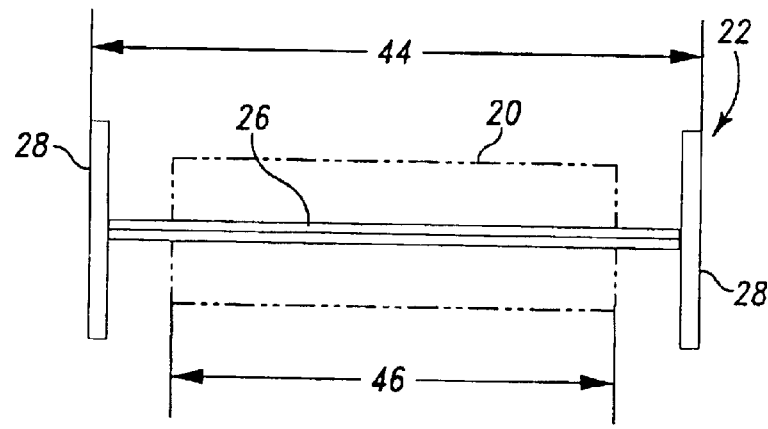
Fig. 11
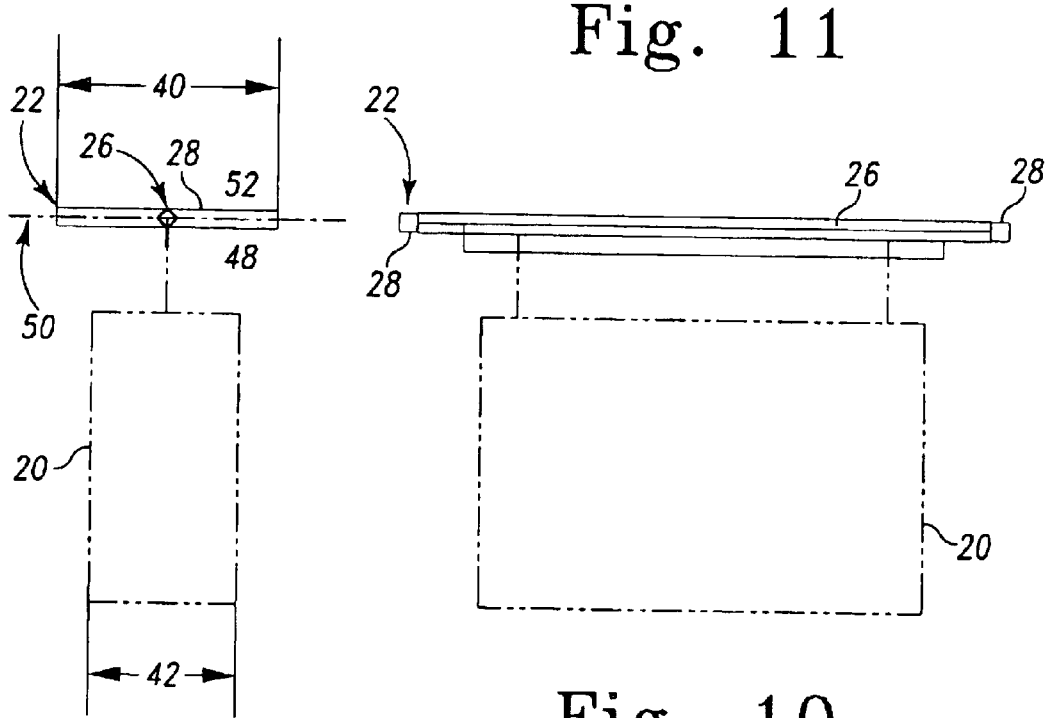
Fig. 9
Fig. 10

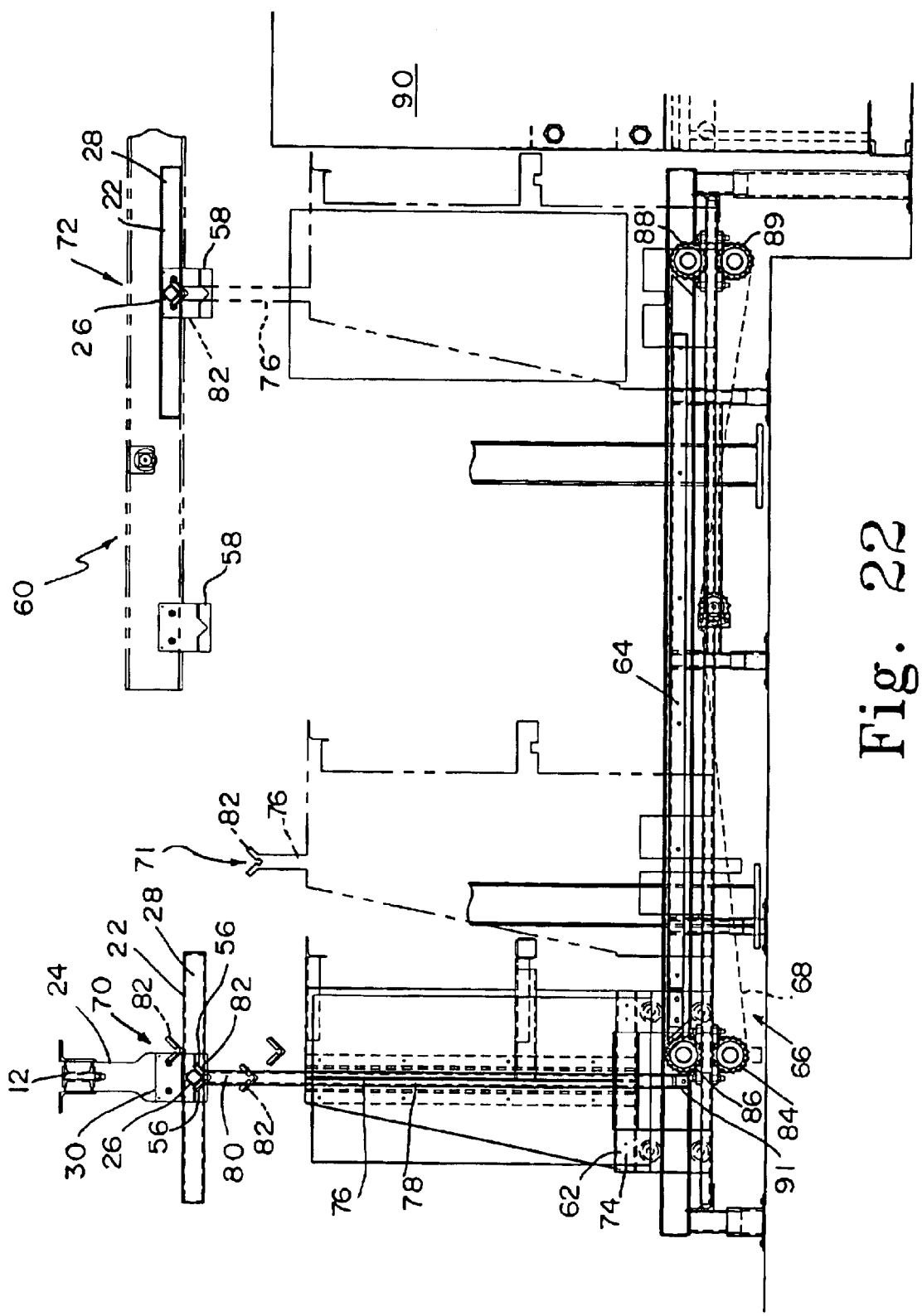

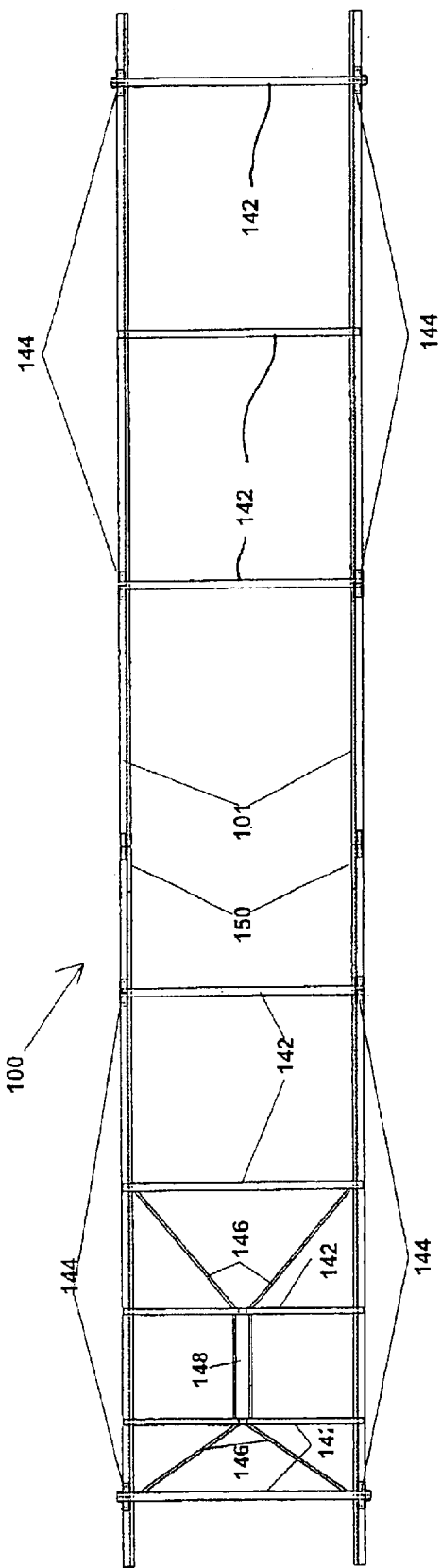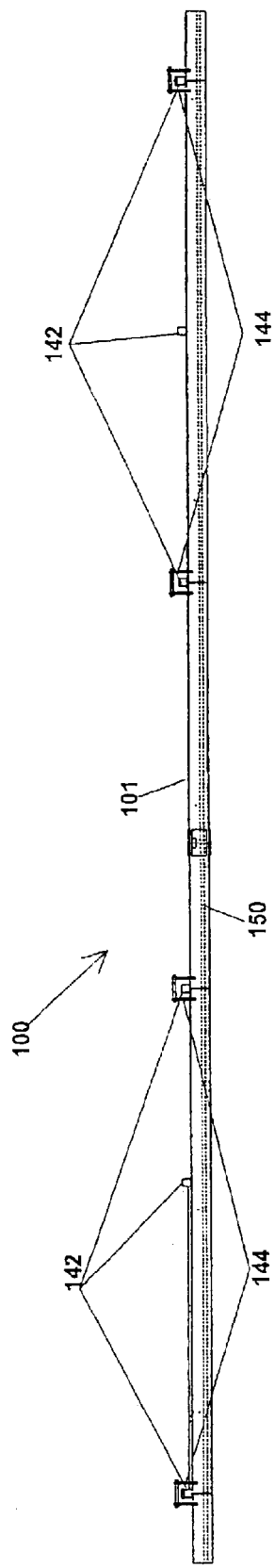
Fig. 28
Fig. 29

COATING AND CURING SYSTEM

This application claims benefit of U.S. Provisional Patent Application Serial No. 60/293,807 filed May 25, 2001.

This invention relates generally to material handling in a manufacturing environment requiring multiple steps to be performed at distinct locations and more particularly to parts transfer through coating and curing stations of a coating and curing system.

It is known to use conveyor systems to automate the transfer of parts between various work stations. One example of such a part indexing and positioning apparatus is disclosed in two related patents, Acker et al., U.S. Pat. No. 4,942,956 and Acker et al., U.S. Pat. No. 5,012,918, (collectively "Acker et al.") the disclosures of which are illustrative as to the state of the art of push rod conveyors. Acker et al. disclose vertically spaced conveyors of an electrocoating line for intermittent transport of a series of parts through equi-spaced work stations. Acker et al. disclose an over/under conveyor system for an electrocoating line in which parts are coupled to a load bar which is received in a carrier member or a slide bar for transfer through a lower level conveyor of an electrocoating section and an upper level conveyor of a curing section. Push units urge the slide bars and the received load bars coupled to the parts to slide along rail assemblies in a stepped fashion.

Another conveyor system for work pieces is described in Published European Patent Application EP 1 050 495 A2 filed by Eisenmann Corporation, the disclosure of which is instructive regarding the general configuration and operation of walking beam conveyors. The Eisenmann system includes a lower conveyor line, an upper conveyor line, and a pair of lift or transfer mechanisms at the end of each line constructed for moving a work piece. A travel and hoist mechanism and a beam assembly (or walking beam conveyor) are provided for discontinuously moving work pieces along the lower line and raising and lowering them for treatment. The lifting mechanisms include reciprocating arms which are extendable and retractable to facilitate loading and unloading parts onto the upper drying line chain driven conveyor.

The illustrative embodiment is a curing and coating system conveyor for transferring of parts between stations of an electrocoating process with a walking beam conveyor on a lower level, and transferring the same parts through a curing section using a push rod conveyor on an upper level. A loadbar assembly is provided including a segment bar attached to a loadbar to which the parts are coupled. The length of the segment bar influences the incremental distance the push rod conveyor transfers each part during each cycle of a curing process occurring in the curing section.

The illustrative embodiment comprises a two-level coating and curing system with the lower level comprising a plurality of coating or coating related stations spaced along a series path and the upper level comprising a curing section disposed generally congruently above the coating section. A walking beam conveyor advances parts to be coated through the coating section. A push bar conveyor advances the parts through the curing section. The parts are carried on load bar assemblies, each comprising a transversely extending load bar that cooperates with the walking beam conveyor and longitudinally extending segment bars that cooperate with the push bar conveyor. Preferably, the segment bars are rigidly attached at opposite ends of the load bar such that the load bar assembly is an I-shaped or double T-shaped assembly. The length of the segment bars establish the length of each step of the part along the push bar conveyor in the coating section. The distance of the horizontal movement of the walking beam conveyor establishes the length of movement of the part between stations in the coating section. The stations in the coating section are equally spaced apart such that the distance between the centerlines of adjacent stations is equal to the distance of the longitudinal movement of the walking beam conveyor.

The system comprises a lifting conveyor at an exit end of the coating section to raise parts from the coating section to the curing section. The system also comprises a lowering conveyor for accepting parts (load bar assemblies) from the exit end of the curing section. As the push bar conveyor moves load bar assemblies through the curing section step-by-step, the load bar assembly adjacent the exit end of the curing system is pushed by the push bar conveyor onto the lowering conveyor.

The curing section typically will comprise a heating section and a cooldown section. The coating section will typically comprise a plurality of pretreatment stations, a coating station such as an electrocoating station, and a plurality of rinse stations.

The walking beam conveyor comprises an outer frame that moves vertically to raise and lower the parts into stations of the coating section and an inner frame coupled to the outer frame. The inner frame moves longitudinally relative to the outer frame to advance parts to the adjacent station. The inner frame carries saddles for receiving opposite ends of the load bars. The longitudinal displacement between adjacent saddles on the inner frame is equal to the distance between centerlines of adjacent coating stations. Illustratively, the longitudinal range of motion of the inner frame relative to the outer frame is equal to the longitudinal displacement between adjacent saddles and the distance between centerlines of adjacent coating stations.

The loadbar assemblies, one for each part or substrate being moved through the coating system, are provided to cooperate with the walking beam conveyor, the push bar conveyor, the lift conveyor transferring parts upwardly from the coating section to the curing section, the lowering conveyor which removes parts from the curing section, and a conveyor system which feeds the coating and curing system and transfers coated and cured parts to the rest of factory. The loadbar portion of the loadbar assembly serves to support the parts being conveyed or processed. The segment bars rigidly attached to the loadbar serve as spacers for the indexing section of the push bar conveyor. Many advantages to be discussed herein flow from this preferred loadbar assembly structure.

A coating and curing system for coating and curing a plurality of substrates in accordance with the present disclosure includes a coating section, a curing section, a walking beam conveyor, a push bar conveyor and a plurality of loadbar assemblies. The coating section includes a series of processing stations spaced along a path to coat substrates. The curing section is vertically displaced from said coating section. The walking beam conveyor transfers substrates between processing stations of the coating section and is configured for horizontal and vertical movement of the substrates. The push bar conveyor transfers parts through the curing section. Each one of the plurality of load bar assemblies is associated with a different one of the plurality of substrates. Each load bar assembly has a load bar configured to cooperate with the walking beam conveyor to facilitate transfer of the loadbar and its associated substrate through the coating section and a segment bar attached to the loadbar. The length of the segment bar influences incremental movement of the substrate through the push bar conveyor. The walking beam conveyor is configured to horizontally move substrates attached to loadbar assemblies a first incremental distance between adjacent processing stations during each cycle of the system. The push bar conveyor horizontally moves substrates attached to loadbar assemblies a second incremental distance through the curing section during each cycle of the system.

According to another aspect of the disclosure, a circuit like system for processing parts in a plurality of processing steps includes a plurality of loadbar assemblies, a number of processing stations located on a lower level, a number of processing positions located on an upper level, a walking beam conveyor for transferring parts between the number of processing stations, a push rod conveyor for transferring parts through the number of processing positions, a lifting conveyor for transferring parts beteen the walking conveyor and the push rod conveyor and a lowering conveyor for transferring parts from the push rod conveyor to a lower position. The plurality of loadbar assemblies are provided in sufficient amounts for each part to remain coupled to and associated with its own loadbar assembly throughout the plurality of process steps. Each loadbar assembly has a loadbar to which its associated part is coupled and two segment bars each mounted to an opposite end of the loadbar The number of stations for performing process steps are equidistantly spaced along a path at a lower level. Each station has a stand configured to receive and support a loadbar assembly lowered onto the stand. The number of positions for performing process steps are equidistantly spaced along a path on an upper level. The number of positions is greater than the number of stations. The walking beam conveyor has a number of loadbar receivers which exceeds the number of stations. The walking beam conveyor is configured to lower loadbar assemblies supported in the loadbar receivers onto the stands and the lifting conveyor during transition from an up and forward configuration to a down and forward configuration. The walking beam conveyor lifts loadbar assemblies from the stands and a supply stand during transition from a down and reversed position to an up and reversed position. The walking beam conveyor transfers parts forwardly along the path during transition from the up and reversed position to the up and forward position. The push rod conveyor has push rod configured to urge a loadbar assembly coupled to a part positioned adjacent an entry of the path into spaced apart tracks running above the number of positions. The push rod conveyor is configured so that loadbar assemblies supported by the tracks position their associated parts in the number of positions. The lifting conveyor has a rigid horizontally extending arm configured to support a loadbar assembly thereon. The lifting conveyor is configured for reciprocal movement between a lower position wherein a loadbar assembly received in a last loadbar receiver of the walking beam conveyor is vertically above the top of the horizontally extending arm when the walking beam conveyor is in the up and forward position and an upper position wherein the top of the horizontally extending arm is substantially level with the spaced apart tracks. The lowering conveyor has a rigid horizontally extending arm configured to support a loadbar assembly thereon. The lowering conveyor is configured for reciprocal movement between a lower position and an upper position wherein the top of the horizontally extending arm is substantially level with the spaced apart tracks. The walking beam conveyor transfers each part through the number of stations. The walking beam conveyor and lifting conveyor cooperate to transfer each part to the lifting conveyor. The lifting conveyor and the push rod cooperate to transfer the loadbar assembly associated with each part into the tracks of the push rod conveyor. The pushrod conveyor and the lowering conveyor cooperate to transfer each part to the lowering conveyor and the lowering conveyor transfers each part to the lower position.

Additional features, and advantages of the invention will become apparent to those skilled in the art upon consideration of the following detailed description of the preferred embodiment exemplifying the best mode of carrying out the invention as presently perceived.

BRIEF DESCRIPTION OF THE DRAWINGS

In describing the disclosed apparatus, reference will be made to the following drawings in which:

FIG. 9 is a side elevation view of a loadbar assembly of FIG. 1 with a block diagram of a part coupled thereto showing a segment bar of the loadbar assembly;

FIG. 10 is a side elevation view of the loadbar assembly and the block diagram of the part of FIG. 9 rotated through 90 degrees to reveal a loadbar extending between two segment bars;

FIG. 11 is a plan view of the loadbar assembly and block diagram of the part of FIG. 10;

FIG. 22 is a sectional view of the transfer cart conveyor of FIG. 1 showing a transfer cart having a telescoping vertical member terminating in a V-shaped saddle for receipt of the load bar of a load bar assembly and a track upon which the transfer cart rides including a drive system having a perch for selectively raising and lowering the telescoping vertical member, the transfer cart is shown with the telescoping vertical member extended at the monorail-transfer cart load/unload position, the transfer cart is also shown in phantom lines at the home position with the telescoping vertical member retracted and at the walking beam load/unload station with the telescoping vertical member extended;

FIG. 28 is a plan view of the outer frame of the walking beam assembly; and,

FIG. 29 is a side elevation view of the outer frame of FIG. 28.

DETAILED DESCRIPTION OF THE DRAWINGS

Figure 1:
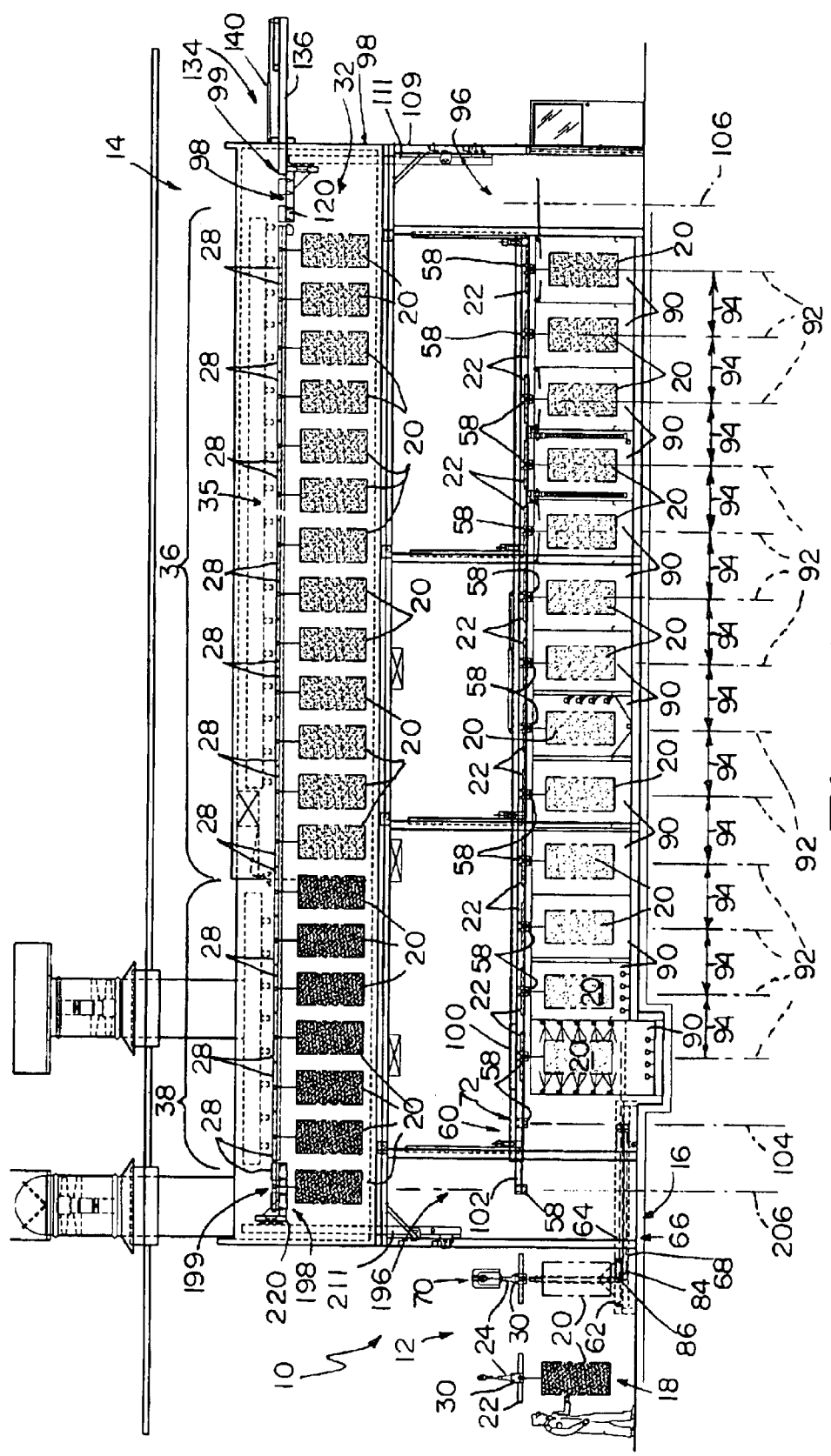
FIG. 1 is a side elevation view of a conveyor system for a factory incorporating an electrocoating operation showing an overhead monorail conveyor to the left with a part to be electrocoated coupled to a load bar assembly positioned over a monorail-transfer cart load/unload position at which a transfer cart of a transfer cart conveyor is located, a walking beam conveyor having a plurality of saddles for receiving parts coupled to load bars for transferring from station to station of a electrocoating system is shown in a down and reversed position, a fully loaded push rod conveyor for urging electrocoated parts through a curing section with an indexing ram is shown located above the walking beam conveyor, an empty lifting conveyor and a loaded finished part conveyor are shown in a raised position.
Figure 2:
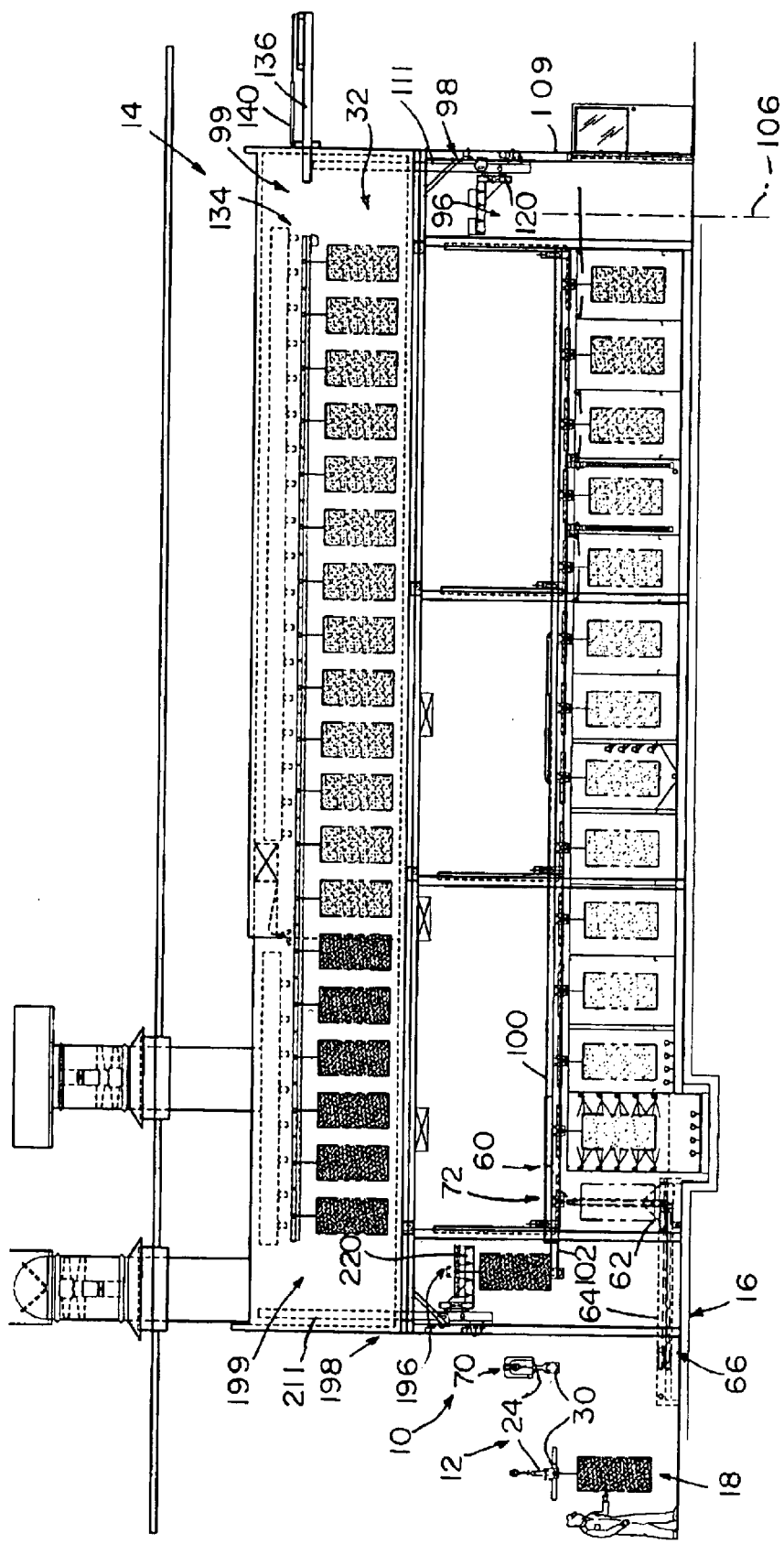
FIG. 2 is a side elevation view of the system of FIG. 1 at a later state in its cycle showing the transfer cart at the transfer cart-walking beam load/unload station holding the load bar assembly coupled to a part to be electrocoated above the second saddle of a down and reversed walking beam assembly and the loaded lowering conveyor and the empty lifting conveyor in a lowered position.
Figure 3:
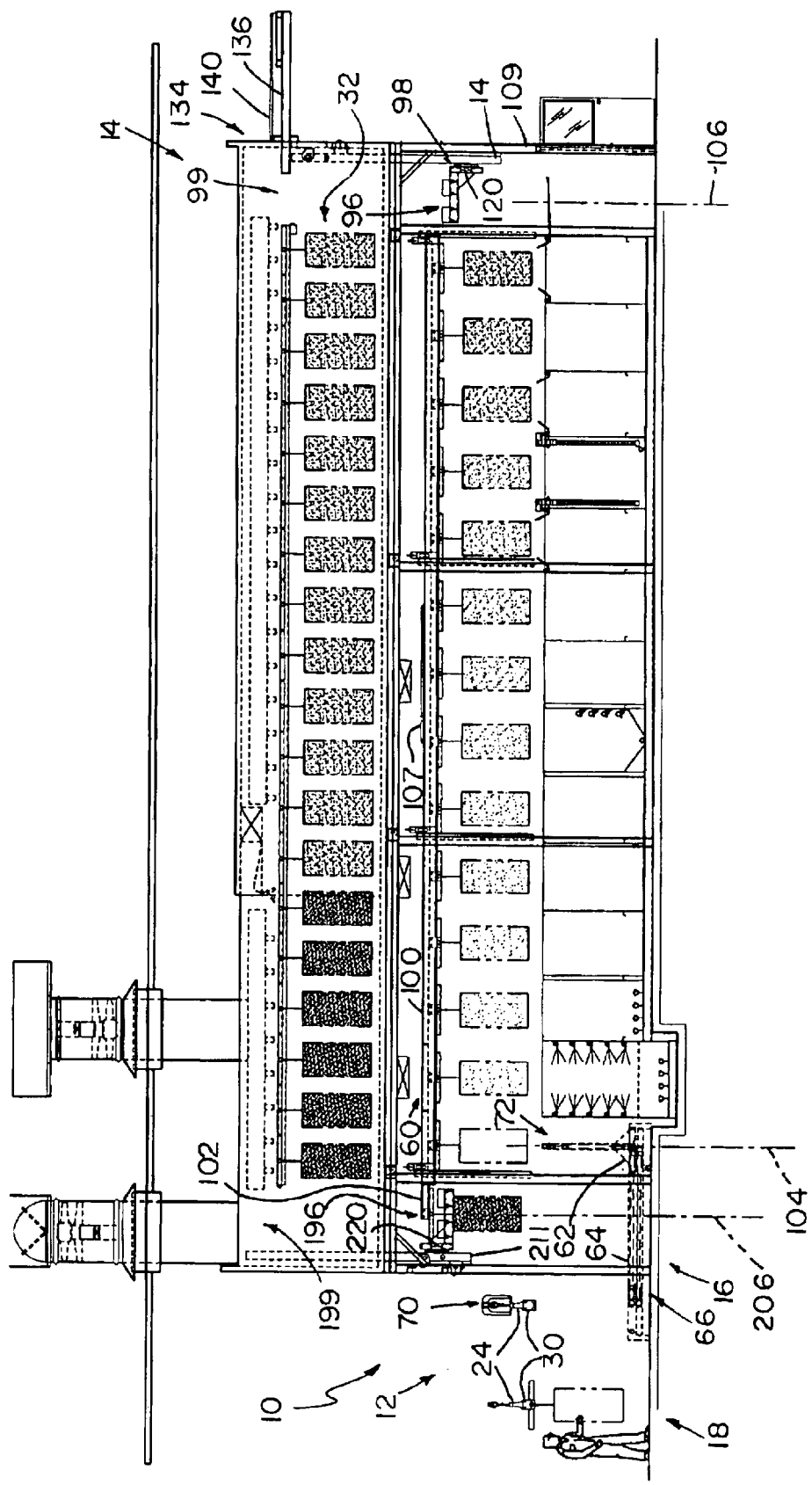
FIG. 3 is a side elevation view of the system of FIG. 2 at a later state in its cycle showing the empty transfer cart at the transfer cart-walking beam load/unload station, the walking beam conveyor in an up and reversed position holding a finished part received from the lowering conveyor in its first saddle, a part to be electrocoated received from the transfer cart in its second saddle and an electrocoated part in its last saddle, the empty lowering conveyor and the empty lifting conveyor in their lower positions.
Figure 4:
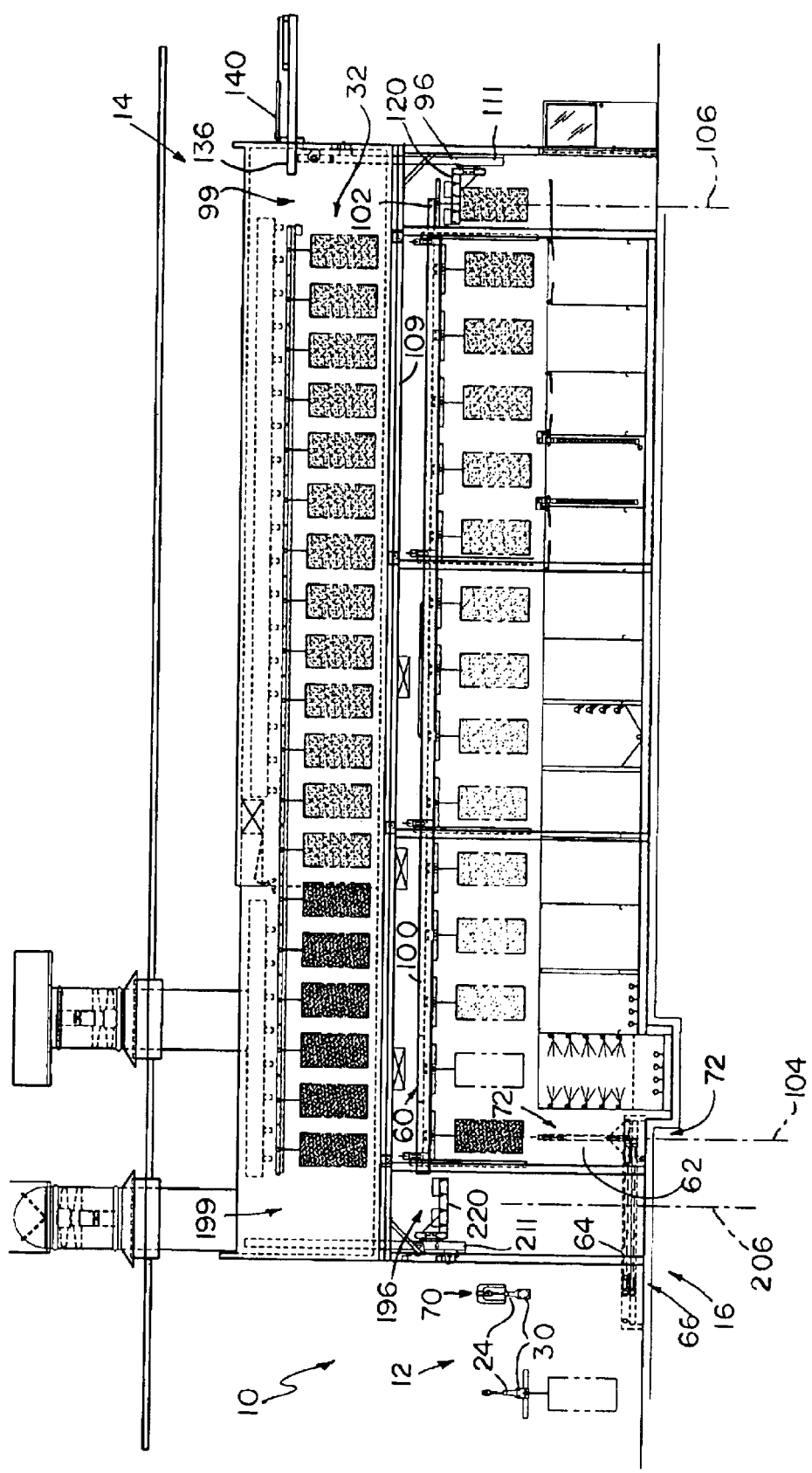
FIG. 4 is a side elevation view of the system of FIG. 3 at a later state in its cycle showing the walking beam conveyor in an up and forward position holding a finished part received from the finished part conveyor in its first saddle above the transfer cart-walking beam load/unload station, a part to be electrocoated received from the transfer cart in its second saddle above the first tank of the electrocoating process and an electrocoated part in its last saddle slightly above the lifting conveyor.
Figure 5:
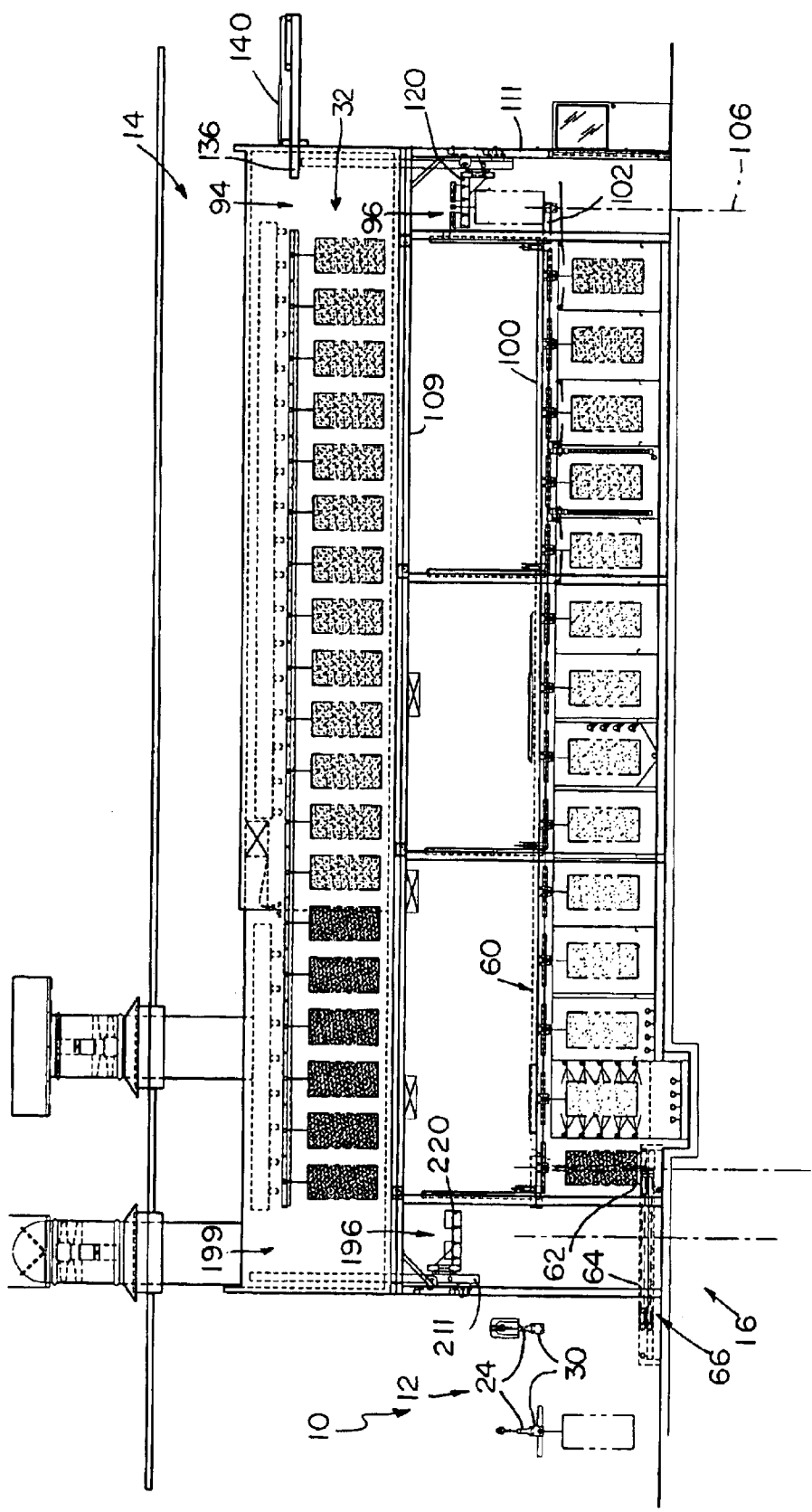
FIG. 5 is a side elevation view of the system of FIG. 4 at a later state in its cycle showing the transfer cart loaded with a finished part at the transfer cart-walking beam load/unload station, the walking beam conveyor in a down and forward position having deposited the finished part previously in its first saddle in the transfer cart at the transfer cart-walking beam load/unload station, the electrocoated part previously in its last saddle on the lifting conveyor, all of the load beams of the other parts previously held in its other saddles on stands associated with tanks of the electrocoating process.
Figure 6:
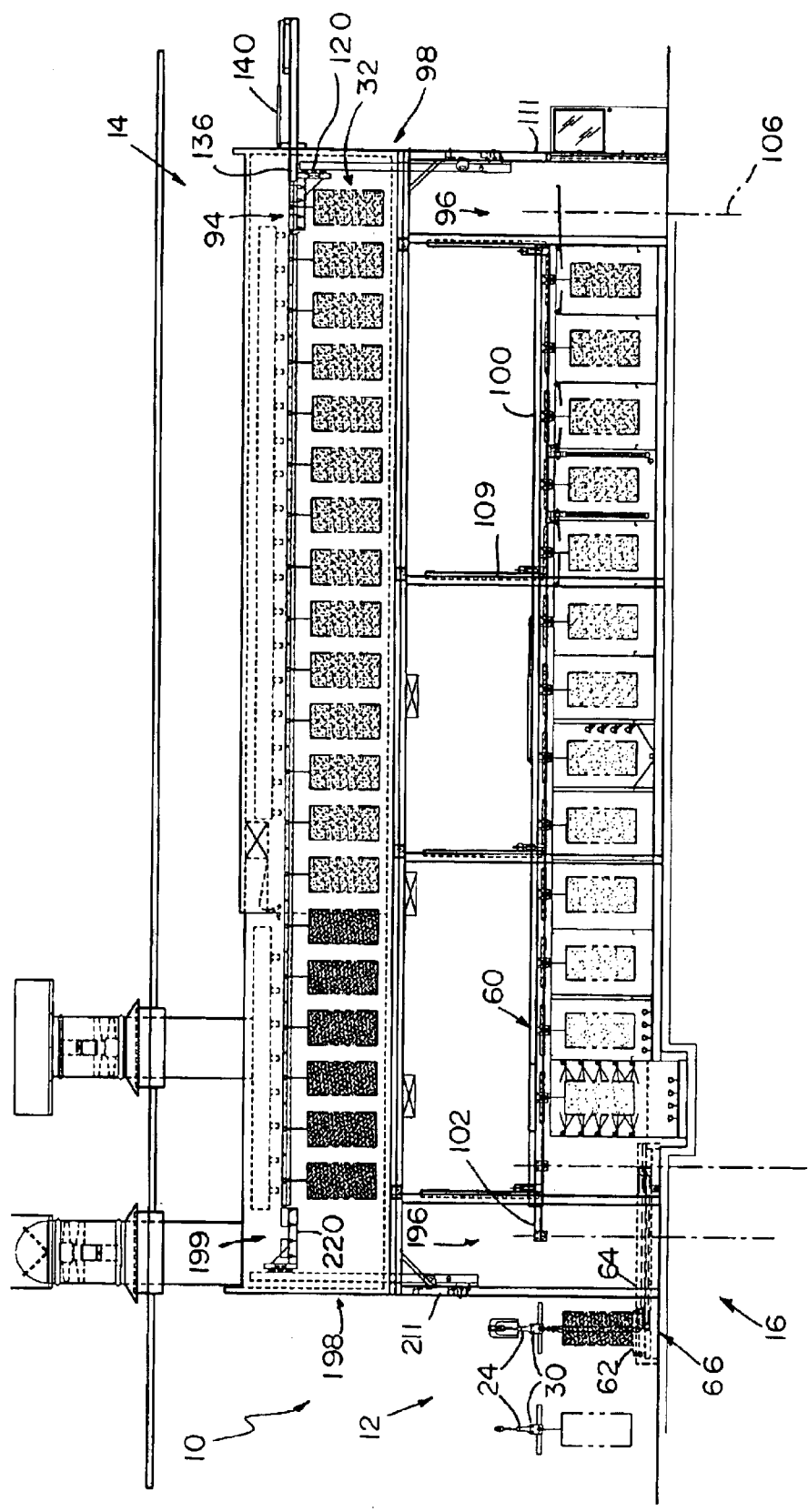
FIG. 6 is a side elevation view of the system of FIG. 5 at a later state in its cycle showing the load bar assembly coupled to the finished part held in the extended telescoping vertical member of the transfer cart at the monorail-transfer cart load/unload position positioned above an empty saddle of a monorail conveyor, the walking beam conveyor in a down and reversed position, the loaded lifting conveyor and the empty lowering conveyor in their raised position.
Figure 7:
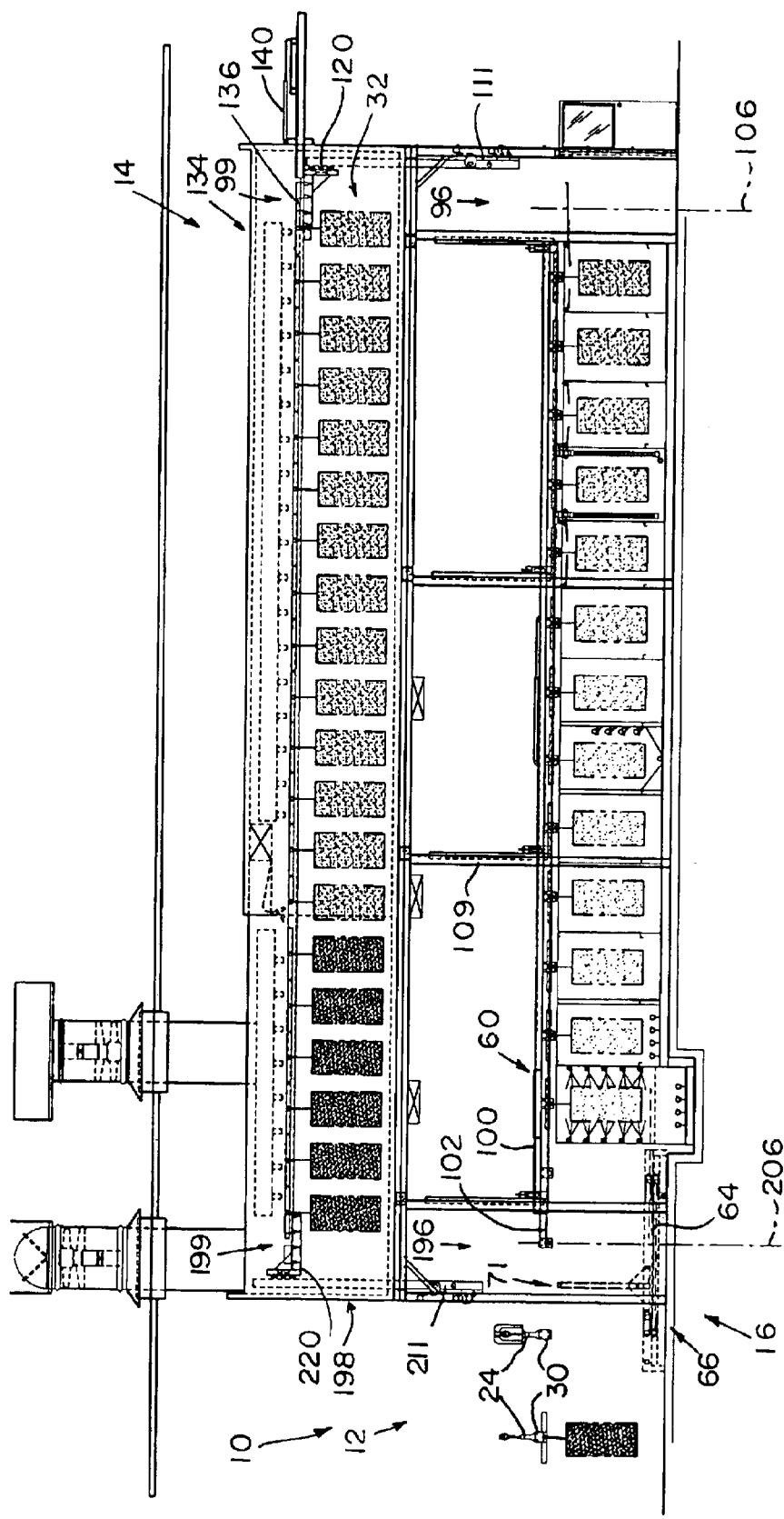
FIG. 7 is a side elevation view of the system of FIG. 6 at a later state in its cycle showing the load bar assembly coupled to the finished part in the saddle of the monorail conveyor at the monorail-transfer cart load/unload station, the empty transfer cart with its telescoping vertical member retracted in a neutral position permitting uninhibited movement of the monorail conveyor so that the finished part may be taken to another location, the indexing ram of the oven conveyor half extended so that the electrocoated part is half on the push rod conveyor and half on the lifting conveyor and a finished part is half on the push rod conveyor and half on the raised lowering conveyor.
Figure 8:
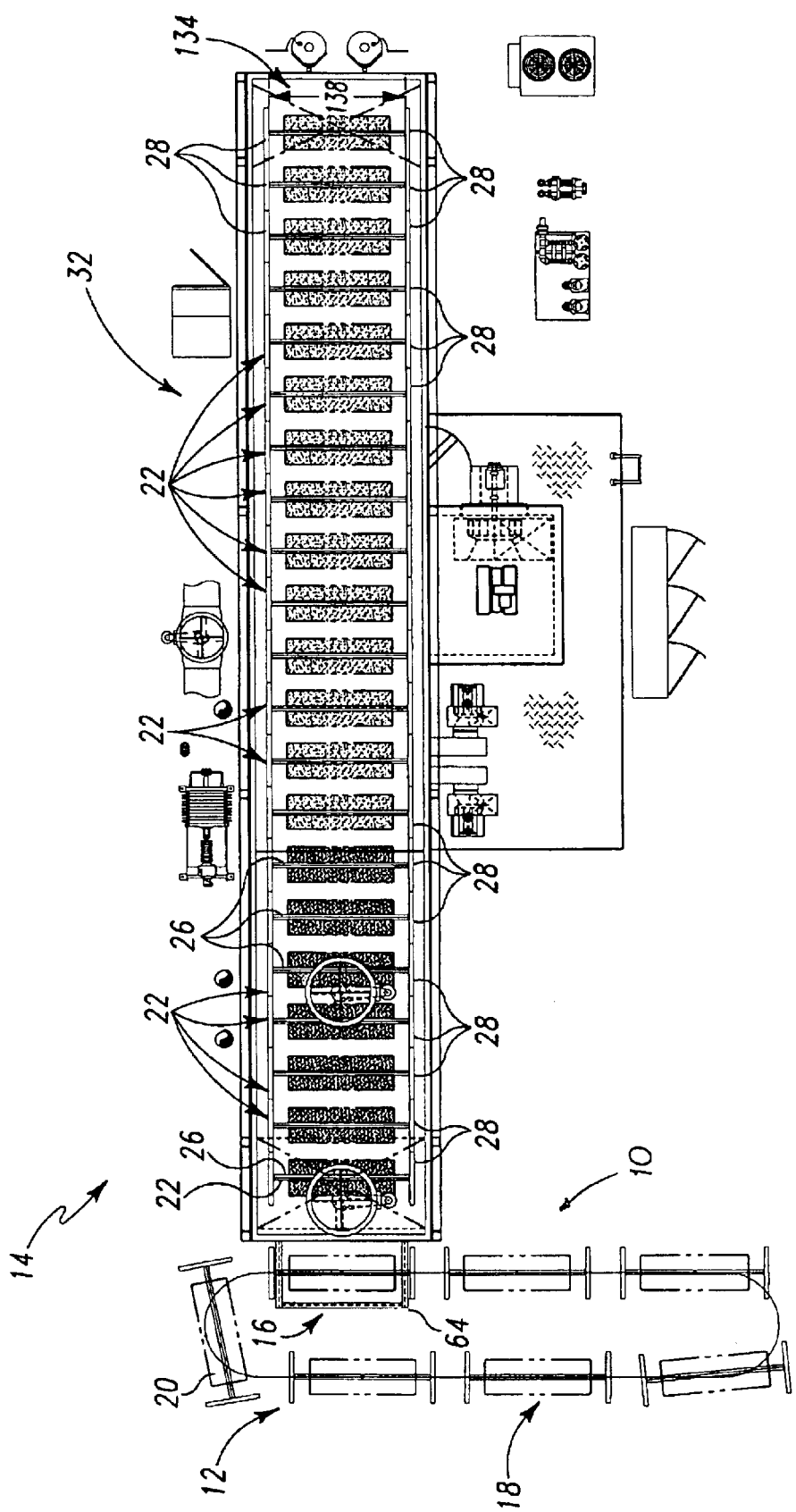
FIG. 8 is a plan view of the apparatus of FIG. 1.

A coating and curing system 14 is provided with part transportation apparatus 10 for moving parts 20 through a factory to a plurality of stations at which various processes are performed on parts 20. Illustratively, part transportation apparatus 10 is incorporated into an electrocoating apparatus 14 with a plurality of electrocoating process stations in a lower coating section 34 and an overhead curing section or compartment 32 having a heating section 36 and a cooling tunnel or cooldown section 38.

Part transportation apparatus 10 includes overhead conveyor 12, transport cart conveyor 16, walking beam conveyor 60, lifting conveyor 98, push rod conveyor 134 and lowering conveyor 198. Each conveyor 12, 16, 60, 98, 134, 198 of part transportation apparatus 10 is configured to cooperate with loadbar assembly 22 to facilitate appropriate movement of part 20 through electrocoating and curing apparatus 14 and factory. In the illustrated embodiment, the electrocoating process in the lower coating section 34 includes a plurality of pretreatment stations, an electrocoating station, and a plurality of rinsing stations. Part 20 having been electrocoated (illustrated in FIGS. 1–7 as partially shaded) is then cured in a curing oven 35 of heating section 36 and allowed to cool down in cooldown section 38 before being returned to an overhead conveyor 12 as a finished part (shown as fully shaded in FIGS. 1–7) for transport to other locations in the factory. For illustration purposes, untreated or new parts are shown without shading and the shading applied to parts increases after each step in the coating and curing process.

Each station of the electrocoating process is spaced apart from its adjacent stations by a fixed displacement 94 to facilitate transfer of parts 20 between stations using a walking beam conveyor 60. Walking beam conveyor 60 is configured to load a part 20 at one station, transfer part 20 to the adjacent station, and unload part 20 at the adjacent station. After completion of the electrocoating process, walking beam conveyor 60 transfers electrocoated part 20 (shown as shaded) to a lifting conveyor station 96.

At lifting conveyor station 96, part 20 is unloaded from walking beam conveyor 60 onto lifting conveyor 98 which lifts electrocoated part 20 to curing compartment load location 99 adjacent curing compartment 32. When in curing compartment load location 99, lifting conveyor 98 positions loadbar assembly 22 coupled to electrocoated part 20 so that push rod 136 of indexing ram or push rod conveyor 134 loads loadbar assembly 22 onto tracks of push rod conveyor 134 for transfer of part 20 through heating section 36 and cooling tunnel 38 of the curing compartment 32. After completing the curing process, the push rod 136 of the indexing ram conveyor 134 urges loadbar assembly 22 coupled to finished part 20 (shown as highly shaded) onto a lowering conveyor 198 positioned at curing compartment unload location 199 adjacent the exit end of curing compartment 32. From curing compartment unload location 199 lowering conveyor 198 lowers finished part 20 to lowering conveyor station 196. At lowering conveyor station 196, finished part 20 is loaded onto walking beam conveyor 60 for transfer to pick-up/drop-off station 72 where it is loaded onto transfer cart 62 for return to indexing overhead monorail conveyor 12.

Referring to FIGS. 1–8, there is shown a portion of a factory including conveying device 12 for moving parts 20 to different locations in a factory and electrocoating and curing machine 14 incorporating part transportation apparatus 10. Illustratively, conveying device 12 is shown as an indexing overhead monorail forming a loop communicating between monorail-transfer cart load/unload location 70 located adjacent electrocoating machine 14 and load/unload location 18. In the illustrated embodiment, a man is shown loading new parts and unloading finished parts at load/unload location 18. Those skilled in the art will recognize that the loading and unloading of parts 20 may be accomplished using machinery, automated part loaders and the like. Those skilled in the art will also recognize that several non-illustrated locations may exist within indexing overhead monorail loop 12 at which various manufacturing processes can be performed on parts 20. In order to facilitate continuous operation of electrocoating and curing apparatus 14, monorail should deliver a new part each time a finished part is taken away.

Illustratively each part 20 is coupled to a loadbar assembly 22. Indexing overhead monorail 12 includes a plurality of loadbar carriers 24 each formed to include saddles 30 configured for receipt of loadbar 26 of loadbar assembly 22. Similarly configured saddles 58 are found in walking beam conveyor 60 and will be described later.

Referring to FIGS. 9–11, loadbar assembly 22 includes a loadbar 26 extending between segment bars 28. Illustratively, both loadbar 26 and segment bars 28 are manufactured from rigid square metal tubing permanently attached to each other by welding or the like. Those skilled in the art will recognize that segment bars 28 may be otherwise affixed to loadbar 26. Illustratively, segment bars 28 remain rigidly attached to loadbar 26 throughout the transfer of part 20 through the curing section 32.

In the illustrated embodiment segment bars 28 are attached to each end of loadbar 26 so that loadbar assembly 22 is I-shaped. As shown in FIG. 9, each segment bar 28 has a length 40 which is greater than the width 42 of part 20. This length 40 vs. width 42 differential facilitates movement of electrocoated parts 20 through curing section without marring of the coating on the parts 20. Loadbar assembly 22 has an overall length 44 (including the length of the loadbar 26 and two widths of the segment bars 28) that is greater than the depth 46 of part 20, as shown in FIG. 11.

In the illustrated embodiment, loadbar 26 is positioned relative to each segment bar 28 so that one cross-sectional diagonal axis 48 of loadbar 26 is parallel to the longitudinal axis 50 of segment bar 28 and the other cross-sectional diagonal axis 52 of loadbar 26 is perpendicular to the longitudinal axis 50 of segment bar 28. Thus loadbar 26, when the longitudinal axes 50 of segment bars 28 are parallel to the ground, has a diamond shaped cross section with two lower walls 54 forming a V-shape. Walls 54 forming the V-shape engage the side walls 56, 114 forming downwardly extending V-shaped openings in saddles 30, 58 in loadbar carrier 24 and in walking beam conveyor 60, respectively. Walls 54 forming the V-shape and walls 56, 114 forming the V-shaped openings of the saddles 30, 58 cooperate to center loadbar 26 longitudinally, with respect to the direction of movement of part 20 through system 14, within the saddles 30, 58 while permitting loadbar 26 to be removed from saddle 30, 58 with an upward motion relative to saddle 30, 58.

Referring again to FIGS. 1–8, when overhead indexing monorail 12 moves a new part 20 coupled to a loadbar assembly 22 to monorail-transfer cart load/unload location 70, part 20 and loadbar assembly 22 are removed from indexing monorail 12 by transfer cart conveyor 16. Transfer cart conveyor 16 includes a transfer cart 62, a transfer track 64, and a cart drive mechanism 66 including a hydraulic motor 67, a chain 68, lower left sprocket 84, upper left sprocket 86, upper right sprocket 88, lower right sprocket 89, and a perch 91 mounted to chain 68. Illustratively, transfer cart 62 is hydraulically driven along transfer track 64 between monorail-transfer cart load/unload position 70 and electrocoating machine pickup/drop-off station 72. Transfer cart 62 includes a wheeled base or carrier 74 and a vertical element 76 having a fixed frame member 78 attached to the carrier 74 and a vertically telescoping member 80 formed to include a loadbar receiver 82 having an upwardly opening V-shape.

When transfer cart 62 is in the monorail-transfer cart load/unload position 70 for unloading a part 20 from monorail conveyor 12, chain 68 moves perch 91 clockwise around lower left sprocket 84 to raise telescoping member 80 upwardly so that the walls forming V-shaped opening of loadbar receiver 82 lift loadbar 26 out of saddle 30 of the loadbar carrier 24 of overhead monorail 12. Transfer cart 62 with telescoping member 80 still in its elevated position on top of perch begins to be transferred forward when perch rounds upper left sprocket 86. Chain 68 drives cart 62 carrying part 20 along track 64 to walking beam conveyor pick-up/drop-off station 72. In the illustrated embodiment, telescoping member 80 remains in the raised position while transfer cart 62 rests at walking beam conveyor pick-up/drop-off station 72 allowing walking beam conveyor 60 to lift parts 20 off of loadbar receiver 82 during upward movement of walking beam conveyor 60 and to deposit parts 20 in loadbar receiver 82 during downward movement of walking beam conveyor 60.

Those skilled in the art will recognize that upon reaching the pick-up/drop-off station 72, perch 91 may round upper right sprocket 88 to lower telescoping member 80 so that loadbar assembly 22 is deposited or settles into the second set of saddles 58 of a walking beam conveyor 60 which is positioned in its lower position. After lowering telescoping member 80, transfer cart 62 may return to its home position 71 (see FIG. 22) out of the way of the overhead monorail conveyor 12 and the walking beam conveyor 60 during upward and forward movement of walking beam conveyor 60. Prior to downward movement of walking beam conveyor, transfer cart 62 may be returned to pick-up/drop-off station 72. After walking beam conveyor 60 lowers, perch 91 may raise telescoping member 80 to lift loadbar assembly 22 from the first saddle 58 of walking beam conveyor 60.

In the illustrated embodiment of electrocoating machine 14, the electrocoating process includes thirteen stages or stations including a pretreatment process, an electrocoating process, and a post rinse process. The pretreatment process includes the first nine stations. The first station is a spray cleaning station, the second station is an immersion cleaning station, the third station is an immersion rinse station, the fourth station is a second immersion rinse station, the fifth station is an immersion activator station, the sixth station is a zinc phosphate immersion station, the seventh station is a third immersion rinse station, the eighth station is a sealer immersion station, and the ninth station is an R.O. Rinse with spray halo exit on withdrawal station. The electrocoating process occurs in the tenth station. The post rinse process includes the final three stations. The eleventh station is a first immersion recirculating permeate rinse station, the twelfth station is a second immersion recirculating permeate rinse station, and the thirteenth station is a recirculating R.O. immersion with spray withdrawal station. Illustratively, each of these stations occurs in a separate tank 90. Each tank 90 is positioned so that its centerline 92 is displaced from the centerline 92 of an adjacent tank 90 by an incremental distance 94, illustratively forty-eight inches. Each tank 90 includes a stand (not shown) associated therewith to receive a loadbar assembly 22 and hold the same during processing.

Walking beam conveyor 60 transfers parts 20 between each station of the electrocoating process as well as between the pick up/drop off station 72, the lifting conveyor station 96 where part 20 is unloaded from walking beam conveyor 60 onto lifting conveyor 98 and the lowering conveyor station 196 where part 20 is unloaded from lowering conveyor 198 onto walking beam conveyor 60. Walking beam conveyors are known and will not be described in excessive detail. Generally, the illustrated walking beam conveyor 60 includes an outer frame 100, an inner frame 102 and a horizontal movement hydraulic cylinder 105. Both frames 100, 102 are generally fabricated from structural steel sized to handle the loads encountered.

Outer frame 100 includes a two parallel spaced-apart beams 101 coupled together with a plurality of cross-members 142. Each beam 101 includes an inwardly extending flange 150 forming a track for wheels 162 of inner frame 102 to ride on top of and a guide for side guide rollers 164 of inner frame 102. Outer frame 100 also includes a plurality of chain connection locations 144, a plurality of braces 146 and a cylinder mounting weldment 148. Cylinder mounting weldment 148 extends longitudinally between two cross members 142 and provides a location for mounting horizontal movement hydraulic cylinder 105. Braces 146 extend between the two cross-members 142 to which cylinder mounting weldment 148 is coupled and the next outwardly adjacent cross-members 142 to provide reinforcement to outer frame 102, as shown, for example, in FIG. 28. Chain connection locations 144 provide places for coupling one end of leaf chains to outer frame 100. Leaf chains pass over idler pulleys (not shown) and the other ends of leaf chains are coupled to vertical movement hydraulic cylinder 107 which actuates vertical movement of outer frame 100 relative to main superstructure 109 of system 14. Outer frame 100 reciprocates vertically between a lowered position and a raised position.

Inner frame 102 includes two spaced-apart beams 103 coupled together by a plurality of transversely extending cross-members 160. Illustratively, transversely extending crossbeams 160 are coupled to the upper portions of the spaced apart beams 103 to provide sufficient room for loadbar assembly 22 to pass horizontally between crossbeams 160 and saddles 58. Inner frame also includes a plurality of wheels 162, a plurality of side guide rollers 164, a plurality of braces 166 and a push plate weldment 168. Push plate weldment 168 is illustratively mounted to the top of one of cross-members 160 to provide a location for coupling piston of horizontal movement hydraulic cylinder 105 to be mounted. Horizontal movement hydraulic cylinder 105 induces reciprocal horizontal movement of inner frame 102 with respect to outer frame 100 to move the parts 20 between stations. Inner frame 102 moves upwardly and downwardly with the movement of outer frame 100 and reciprocates forwardly and rearwardly with respect to outer frame 100. The inner frame 102 has wheels 162 for the frame 102 to roll on to provide a smooth motion and minimize friction. Side guide rollers 164 are also provided that are received in guides mounted to the outer frame 100 to control sway during vertical movement. Frames 100, 102 are raised and lowered with leaf chains running through idler pulleys allowing the outer frame 100 to raise vertically.

Power for vertical movement of the walking beam assembly 60 is provided by a vertical movement hydraulic cylinder 107. In the illustrated embodiment, the outer frame 100 has six feet of vertical travel between the lowered position and the upper position. Parts 20 are submerged in each tank 90 for processing when walking beam conveyor has deposited the loadbar assemblies 22 on the tanks' associated stands 19 during movement to the lowered position. The parts 20 are completely retracted from the tanks 90 for uninhibited transfer of the parts 20 between tanks 90 when the walking beam conveyor 60 is in the upper position.

Power for forward and reverse horizontal movement of inner frame 102 relative to the outer frame 100 is provided by horizontal movement hydraulic cylinder 105. Horizontal movement hydraulic cylinder 105 is mounted on cylinder mounting weldment 148 of outer frame 100 and its associated piston rod is mounted on push plate weldment 168 of inner frame 102. In the illustrated embodiment, inner frame 102 has a forty-eight inch horizontal range of motion with respect to outer frame 100 between a forward position and a reverse position. The horizontal range of motion corresponds with the centerline displacement 94 between adjacent tanks 90 and stations 72, 96, 196.

The illustrated electrocoating and curing apparatus 14 includes a hydraulic unit 170 that provides hydraulic pressure to vertical movement hydraulic cylinder 107 and horizontal movement hydraulic cylinder 105, as well as other hydraulically powered cylinders and motors of the apparatus. Hydraulic unit 170 controls both the vertical movement of the outer frame 100 and horizontal movement of the inner frame 102. The vertical and horizontal motions of the frames 100, 102 are completely independent of each other as hydraulic control unit 170 is configured to operate only one cylinder at a time. In the illustrated embodiment, forward movement of inner frame 102 occurs only when walking beam conveyor 60 is in the upper position and rearward movement of the inner frame 102 occurs only when the walking beam conveyor 60 is in the lowered position. Valves and controls, well known to those skilled in the art, are provided for the hydraulic control unit 170.

A plurality of associated pairs of saddles 58 extend inwardly from each beam 103 of inner frame 102 for receipt of a loadbar assembly 22 therein. In the illustrated embodiment, there are fifteen pairs of saddles 58. Thirteen of the pairs of saddles 58 are directly over the centerlines 92 of the thirteen tanks 90, one of the pairs of saddles 58 is directly over the centerline 104 of the pick-up/drop-off station 72, and one of the pairs of saddles 58 is directly over the centerline 106, 206 of one of the vertical transfer stations 96, 196 when the walking beam conveyor 60 is in the forward or reverse positions. In the illustrated embodiment, the first associated pair of saddles 58 reciprocates horizontally between a reverse position directly over the centerline 206 of the lowering vertical transfer station 196 and a forward position directly over the centerline 104 of the pick-up/drop-off station 72. The second associated pair of saddles 58 reciprocates horizontally between a reverse position directly over the centerline 104 of the pick-up/drop-off station 72 and a forward position directly over the centerline 92 of the station 1 tank 90. The last associated pair of saddles 58 reciprocates horizontally between a reverse position directly over the centerline 92 of the station 13 tank 90 and a forward position directly over the centerline 106 of the unloading or lifting vertical transfer station 96.

In the illustrated embodiment each of the saddles 58 is formed to include an inwardly extending bottom wall 110 and an upwardly and inwardly extending inner wall 112 formed to include a V-shaped opening defined by upwardly facing walls 114. Bottom wall 110 of saddle 58 receives the bottom of a segment bar 28 of a loadbar assembly 22 supported by the saddle 58. When a slightly laterally misaligned loadbar assembly 22 is received in saddle 58, inclined inner walls 112 cooperate with the segment bar 28 to improve lateral alignment of the loadbar assembly 22. The illustrated V-shaped opening is sized to receive the loadbar 26 and center the same longitudinally (with respect to the direction of movement of part through coating section 34) within the opening. The center of the V-shaped opening is positioned at the centerline 116 of the saddle 58. The centerline 116 of each associated pair of saddles 58 is displaced from the centerline 116 of an adjacent associated pair of saddles 58 by a distance 118 equal to the horizontal range of motion of the inner frame 102 with respect to the outer frame 100 and the centerline displacement 94 between adjacent tanks 90 and stations 72, 96, 196.

Lifting conveyor 98 is a hydraulically powered vertically reciprocating conveyor. Lifting conveyor 98 is furnished to transfer parts 20 from walking beam conveyor 60 upwardly to an oven loading position adjacent curing section 32. Oven load or vertical transfer hydraulic cylinder 172 is mounted at lower level of main superstructure 109 and remains out of the high temperature adjacent overhead oven 35. Lifting conveyor 98 is raised and lowered through the use of leaf chains coupled to vertical transfer hydraulic cylinder 172 and lifting carriage 120 of lifting conveyor 98.

In the illustrated embodiment, lifting conveyor 98 includes a lifting carriage 120 having two horizontally extending fixed arms 122, 124 each formed to include two flanges 126, 128 extending outwardly from the top surface. Lifting carriage is mounted for vertical movement along upright beams 111 relative to superstructure 109. Arms 122, 124 are spaced apart from each other by a distance less than the distance between the saddles 58 of an associated pair of saddles 58 so that arms 122, 124 do not interfere with the vertical movement of the walking beam conveyor 60. Flanges 126, 128 on each arm 122, 124 are spaced apart by a width greater than the width of saddle 58 so that saddle 58 of walking beam conveyor 60 can move vertically between flanges 126, 128. Flanges 126, 128 extend outwardly from arms 122, 124 a distance sufficient to receive segment bars 28 of loadbar assembly 22 therein. Each flange 126, 128 includes an upwardly extending outer wall 130 prohibiting lateral movement of loadbar assembly 22 to ensure that loadbar assembly 22 is properly positioned for insertion into channels in push rod conveyor 134.

The lateral centerlines of horizontal arms 122, 124 of carriage 120 are positioned to be displaced from centerline 92 of last tank 90 of electrocoating process by a distance equal to each of the centerline displacement 118 of adjacent pairs of saddles 58, the horizontal range of motion of inner frame 102 with respect to outer frame 100, and the centerline displacement 94 between adjacent tanks 90 and stations 72, 96, 196. The lateral centerlines of the arms 122, 124 coincide with the centerline of lifting station 96. Thus forward indexing of inner frame 102 will position loadbar assembly 22 on last saddle 58 on the lateral centerline of horizontal arms 122, 124. During downward movement of walking beam conveyor 60, loadbar assembly 22 on the last pair of saddles 58 is deposited on carriage 120 with segment bars 28 resting on flanges 126, 128.

Carriage 120 travels between a lowered position and a raised position. In the lowered position, the upper surface of the horizontally extending arms 122, 124 is below the lower side of each loadbar assembly 22 when walking beam conveyor 60 is in its upper position. After walking beam conveyor 60 has traveled from its lower position to the upper position and inner frame 102 has been indexed to its forward position, horizontal arms 122, 124 of carriage 120 of lifting conveyor 98 are positioned directly below loadbar assembly 22 of part 20 most recently removed from the last station tank 90. During downward movement of walking beam conveyor 60, flanges 126, 128 on horizontal arms 122, 124 of the carriage 120 engage lower side of segment bars 28 of loadbar assembly 22 transferring loadbar assembly 22 from last saddle 58 of walking beam conveyor to lifting conveyor 98. Lifting conveyor 98 subsequently transfers loadbar assembly 22 and its associated part 20 to upper curing section 32.

When carriage 120 reaches its upper position or curing compartment load location 99, loadbar assembly 22 is positioned so that loadbar 26 can be urged off of flanges 126, 128 on horizontal arms 122, 124 of carriage 120 into tracks of the push rod conveyor 134. Lifting conveyor 98 subsequently returns to its lowered position at lifting conveyor station 96 to await receipt of the next part 20 completing the electrocoating process.

Figure 12:
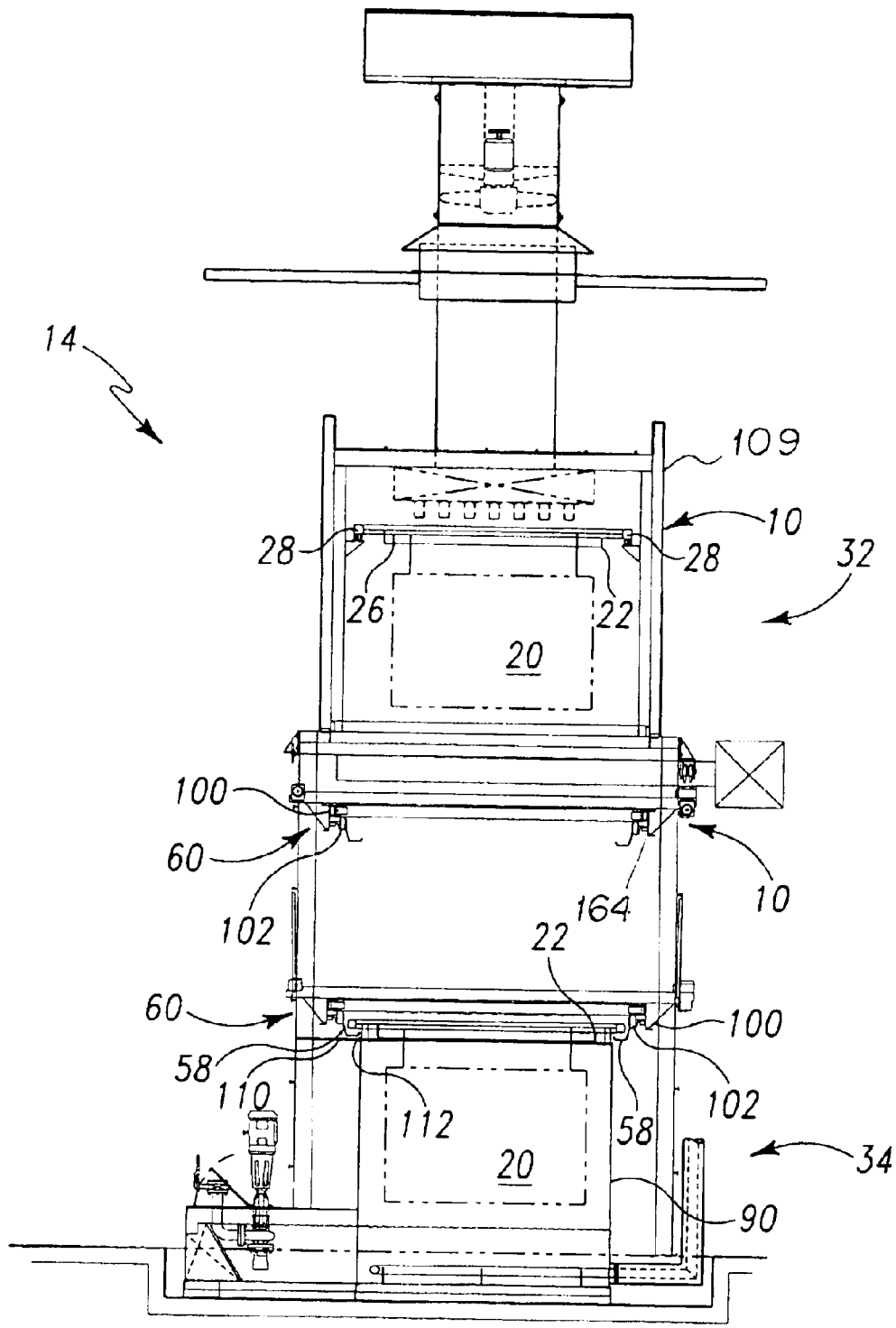
FIG. 12 is a sectional view through line 12—12 of FIG. 1 showing station 1 of a pretreatment process of the electrocoating process on the lower level and the cooldown stage of the curing process on the upper level.
Figure 13:
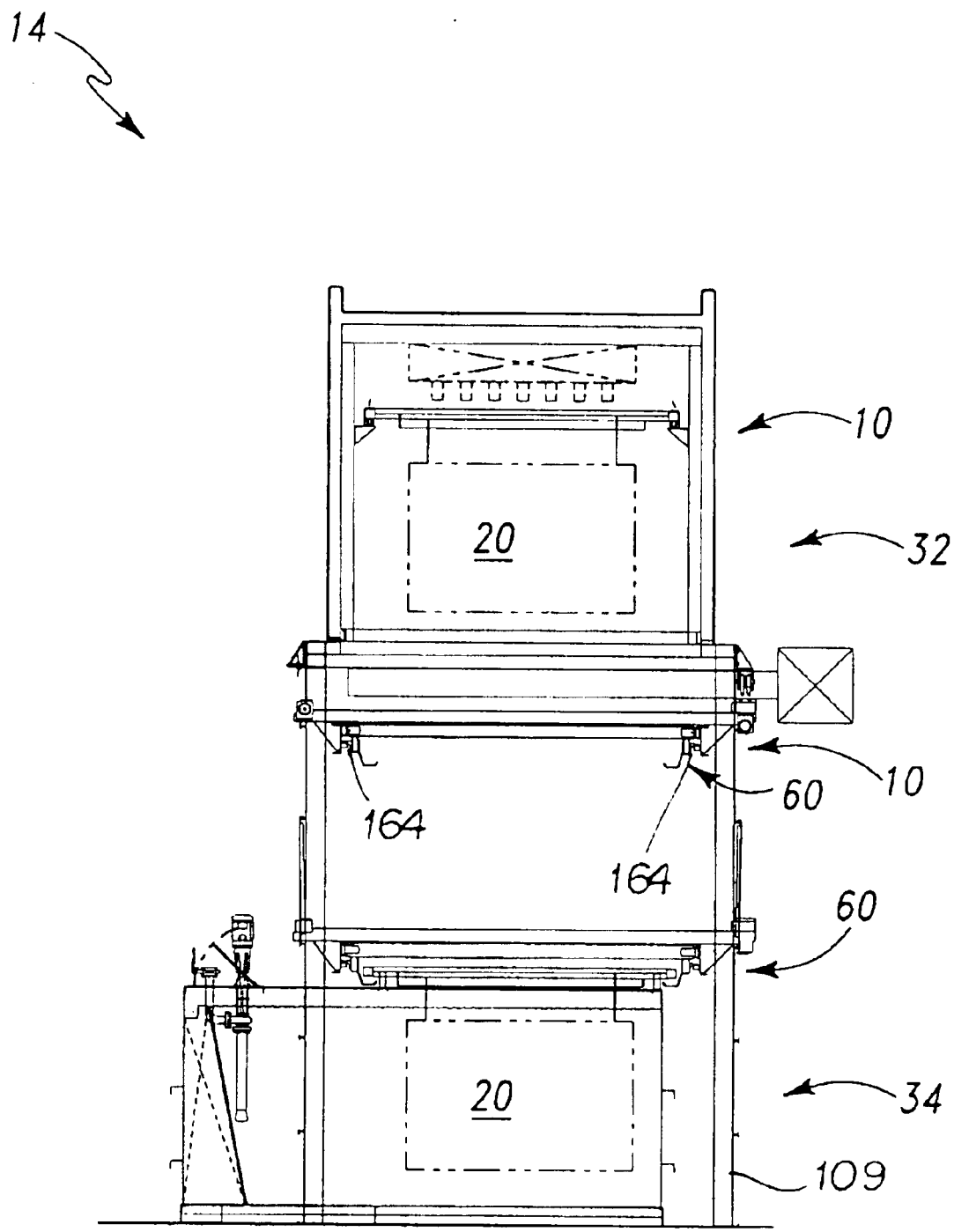
FIG. 13 is a sectional view along line 13—13 of FIG. 1 showing station 5 of a pretreatment process of the electrocoating process on the lower level and the curing oven of the curing process on the upper level.
Figure 14:
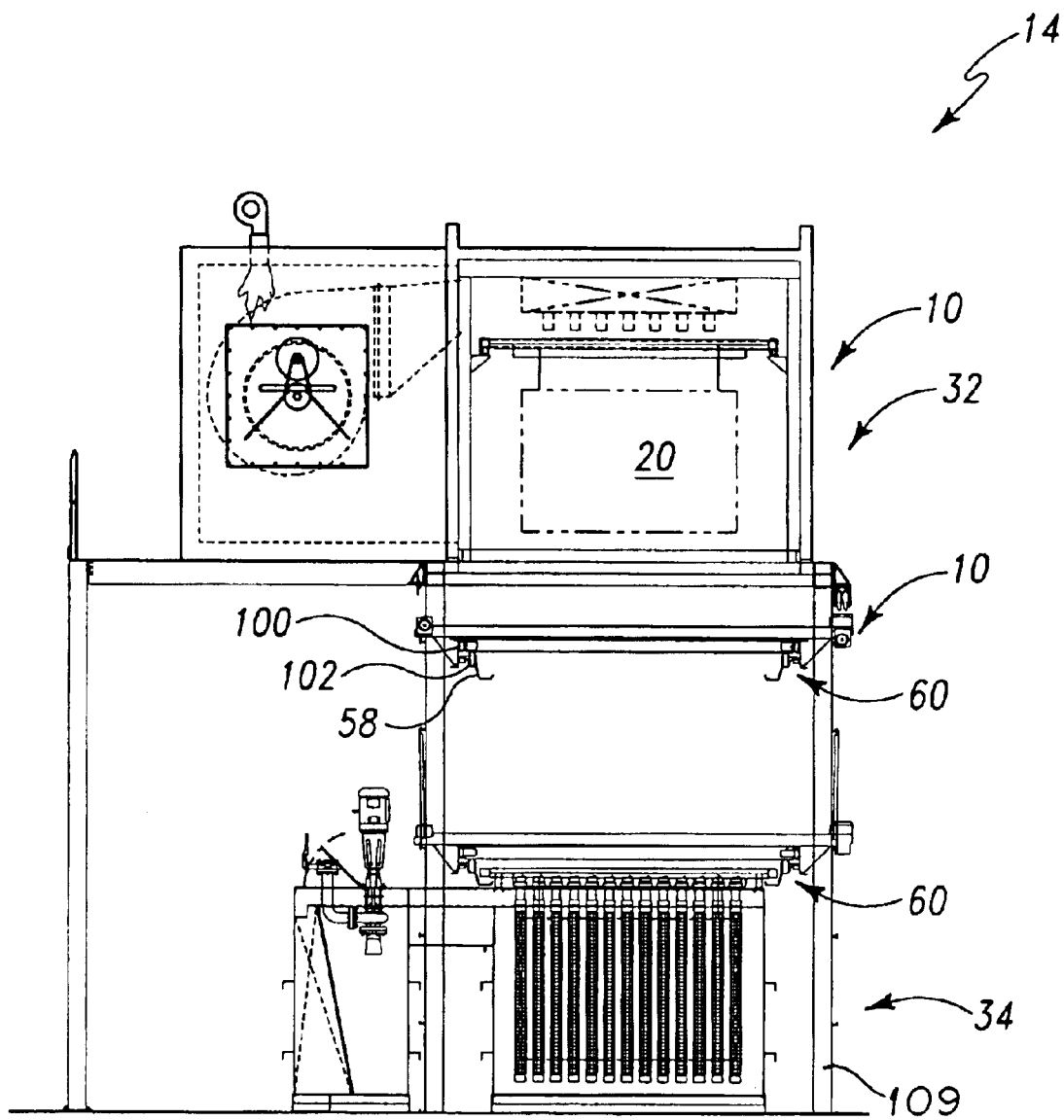
FIG. 14 is a sectional view along line 14—14 of FIG. 1 showing the electrocoat station of the electrocoating process on the lower level and the cure oven of the curing stage on the upper level.
Figure 15:
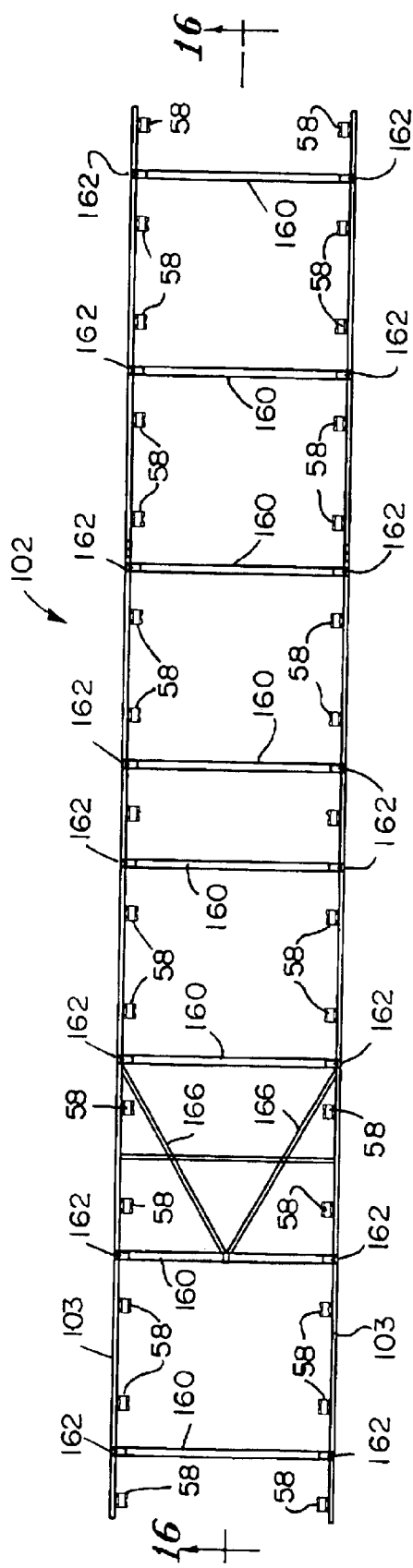
FIG. 15 is a plan view of the inner frame of the walking beam assembly.
Figure 16:
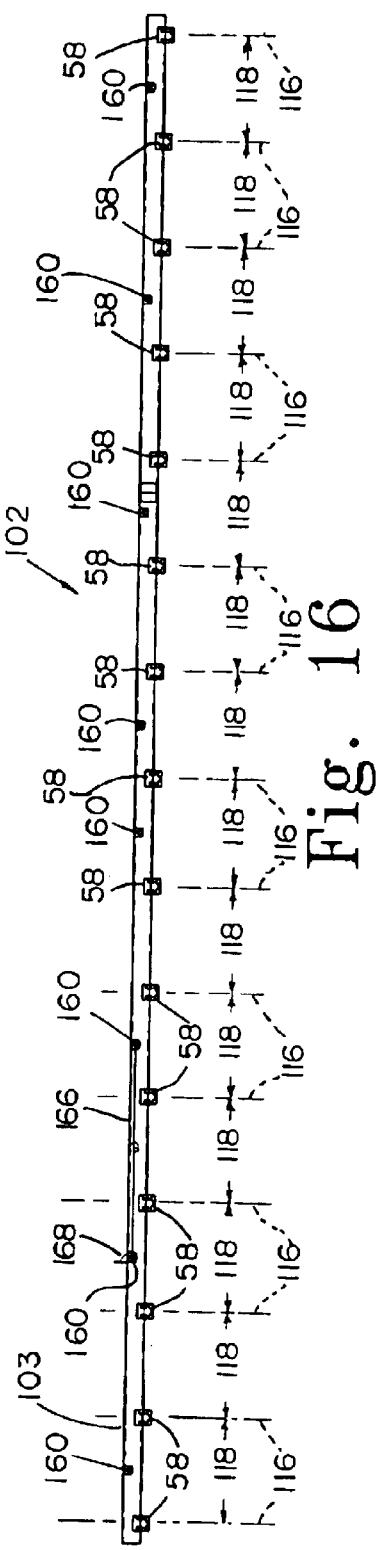
FIG. 16 is a sectional view of the inner frame of the walking beam assembly through line 16—16 of FIG. 15.
Figure 18:
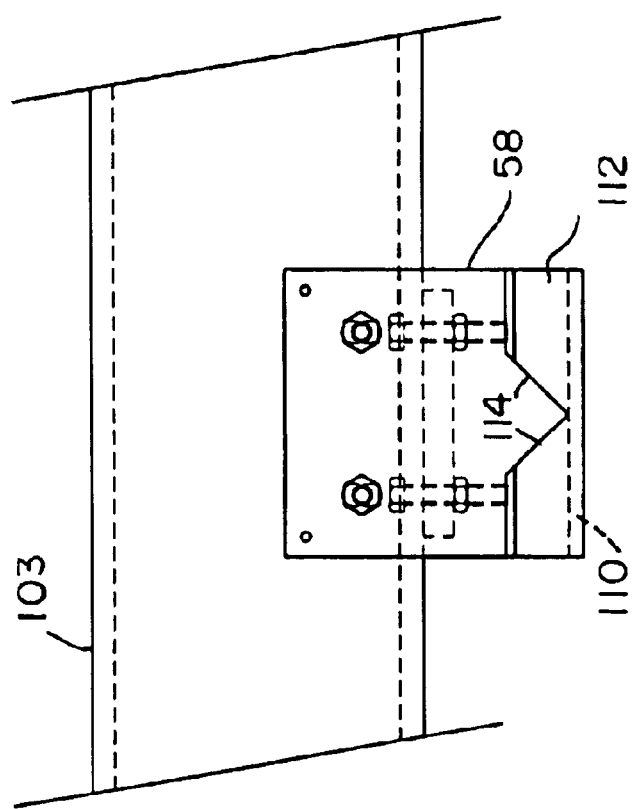
FIG. 18 is a view with portions broken away of the inner frame of FIG. 15 showing a saddle configured to receive one end of a load bar assembly.
Figure 17:
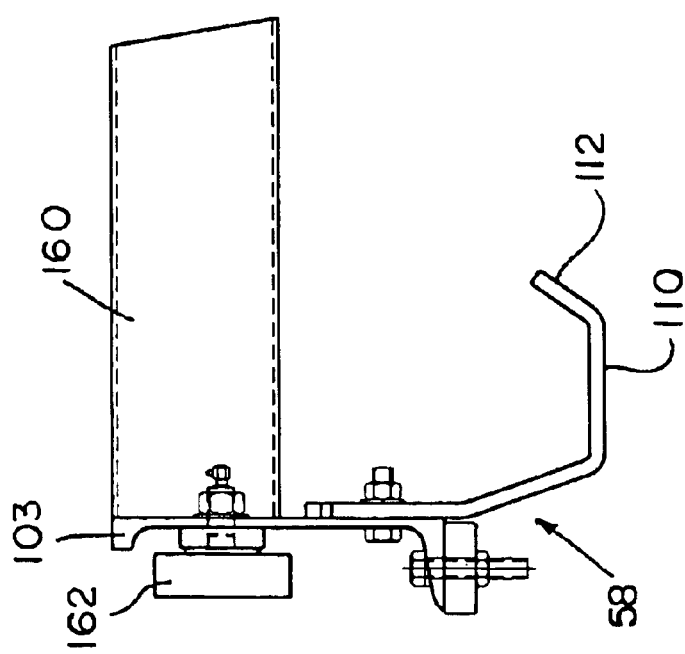
FIG. 17 is sectional view of the inner frame of the walking beam assembly taken through line 17—17 of FIG. 15 showing a side elevation of a saddle configured to receive one end of a load bar assembly and portions of a cross beam extending between parallel beams of the inner frame.
Figure 21:
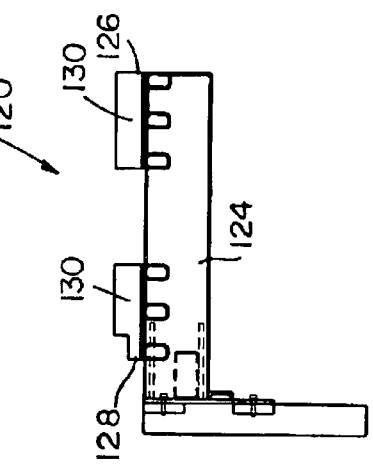
FIG. 21 is a side elevation view of the truck of FIG. 20.
Figure 19:
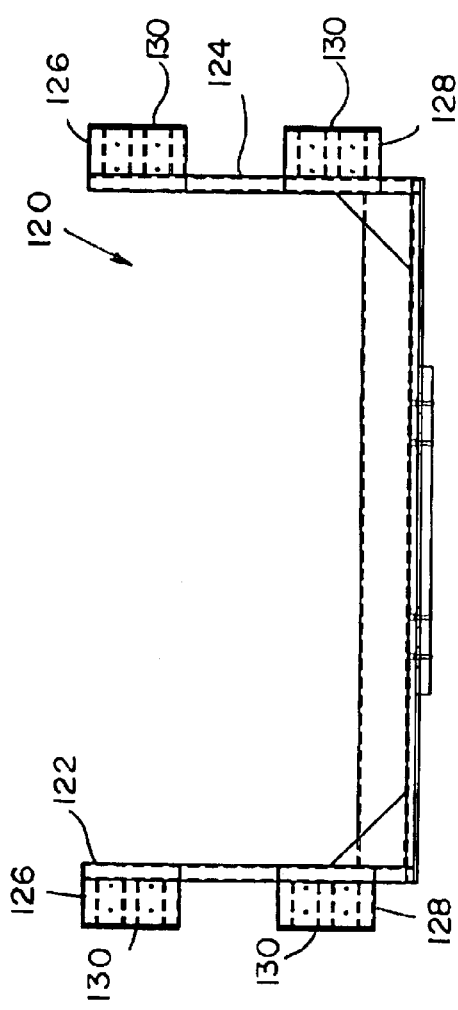
FIG. 19 is a plan view of the truck of the lifting conveyor of the type shown in FIG. 1, the truck of the lowering conveyer is identically configured so dual reference numerals appear in the drawing.
Figure 20:
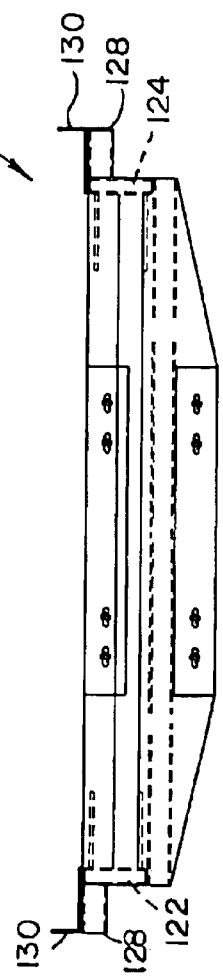
FIG. 20 is a side end elevation view of the truck of FIG. 19.
Figure 23:
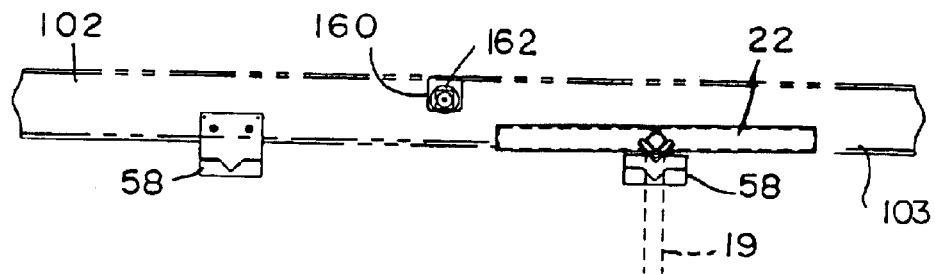
FIG. 23 is a partial sectional view of the second and third saddles of the walking beam conveyor in a lowered and reversed position showing a loadbar assembly supported on a stand for the first tank of the electrocoating process.
Figure 24:
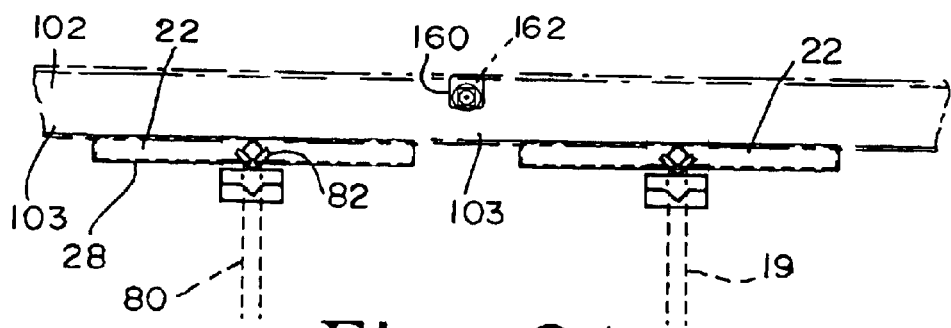
FIG. 24 is a partial sectional view similar to FIG. 23 but at a later stage in the cycle of the conveyor showing a loadbar supported by an extended telescopic vertical member of the transfer cart above the second saddle of the walking beam conveyor.
Figure 25:
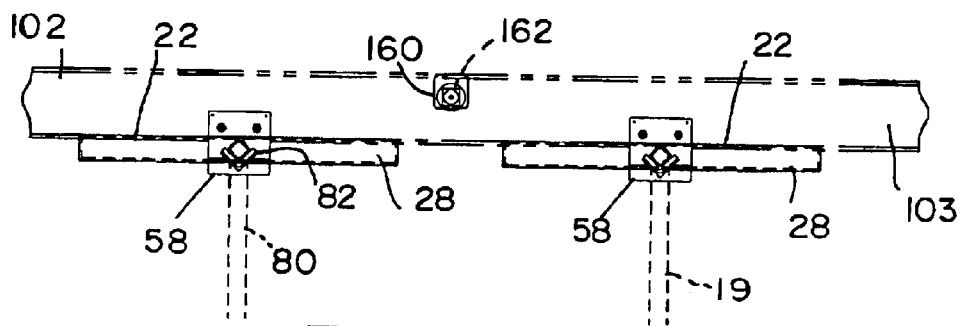
FIG. 25 is a partial sectional view similar to FIG. 24 but at a later stage in the cycle of the conveyor showing the walking beam conveyor during transition between the down and reversed position and the up and reversed position at the point where the saddles are beginning to lift the loadbar assemblies from the extended telescopic vertical member of the transfer cart and the stand associated with the first tank.
Figure 26:
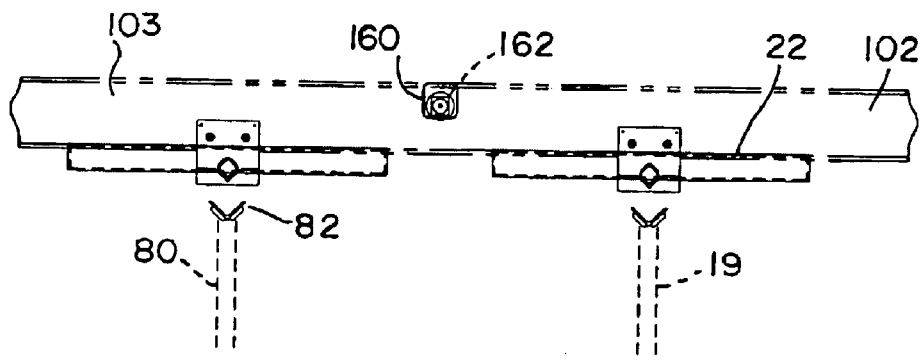
FIG. 26 is a partial sectional view similar to FIG. 25 but at a later stage in the cycle of the conveyor showing the walking beam conveyor during transition between the down and reversed position and the up and reversed position at a point where the saddles have lifted the loadbar assemblies from the extended telescopic vertical member of the transfer cart and the stand associated with the first tank.
Figure 27:
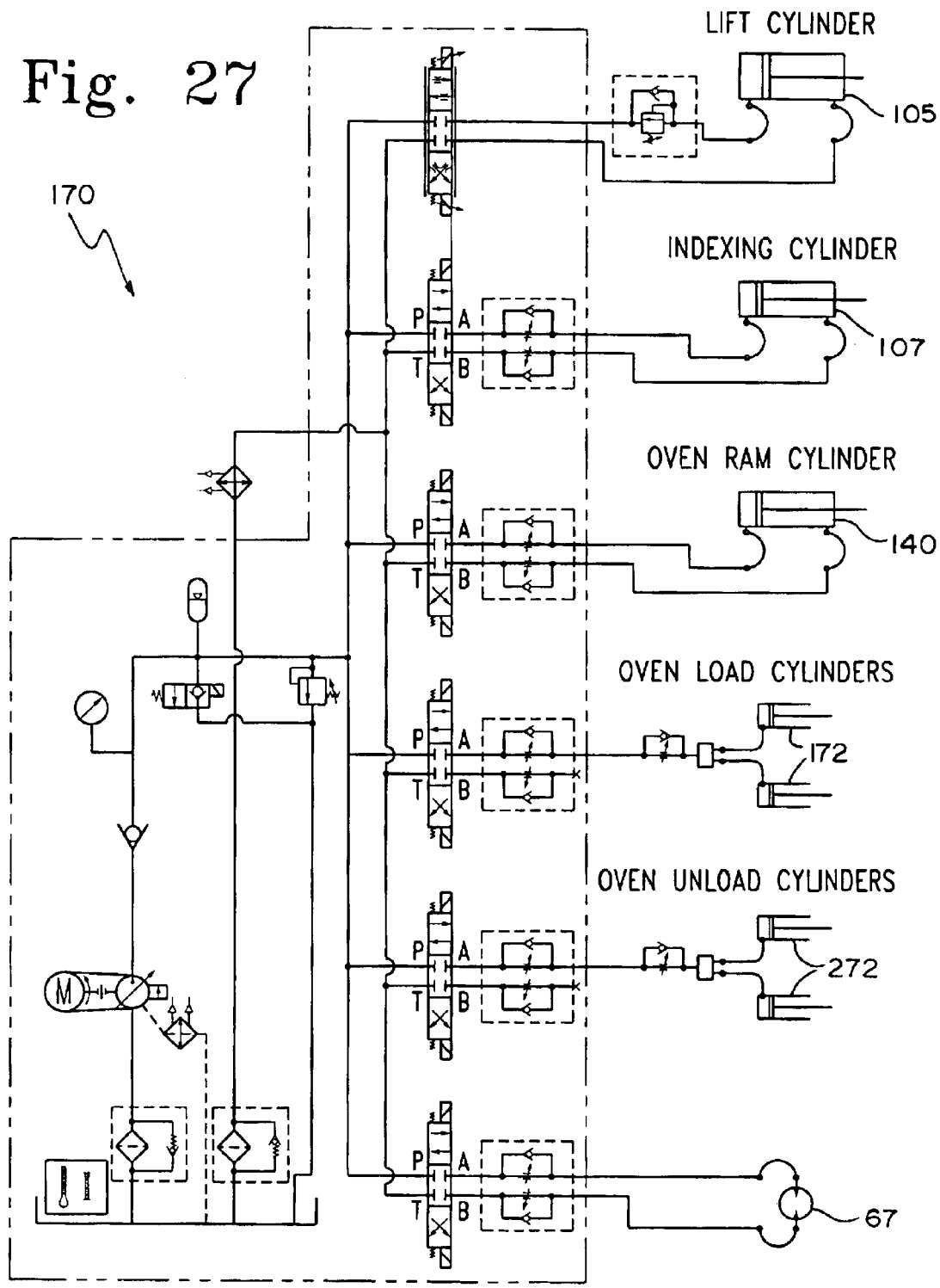
FIG. 27 is a schematic diagram of the hydraulic unit.

Push rod conveyor 134 includes two spaced apart fixed tracks and indexing rams 136. Vertical walls of tracks are separated by a distance 138 slightly greater than or substantially equal to the length 44 of loadbar assembly 22 to permit segment bars 28 of loadbar assembly 22 to ride on tracks through curing section 32. In the illustrated embodiment, as shown for example in FIGS. 12–14, tracks 132 are C-shaped channels within which rollers 135 are located on which segment bars 28 of loadbar assembly 22 ride.

In the illustrated embodiment, indexing ram 136 is driven by two oven ram hydraulic cylinders 140. Indexing ram 136 has a range of motion sufficient to urge loadbar assembly 22 from carriage 120 of lifting conveyor 98 and into contact with the loadbar assembly 22 last loaded onto tracks and urge all of the loadbar assemblies 22 on tracks forward by the length 40 of its segment bar 28. Since in the illustrated embodiment, each of loadbar assemblies 22 is substantially identical in configuration having segment bars 28 thirty-six inches long, push rod conveyor 134 indexes each loadbar assembly 22 and its associated part 20 forward in thirty-six inch increments. In the illustrated embodiment, the incremental movement of the parts 20 through the curing section 32 induced by the push rod conveyor 134 is different than the incremental movement through the electrocoating process induced by the walking beam conveyor 60. Since in the illustrated embodiment, curing section 32 is the same length as the combined stations of the electrocoating process, pick-up/drop-off station 72 and vertical transfer stations 96, 196, parts 20 spend more time in the curing section 32 than in the coating section 34.

In the illustrated embodiment of the electrocoating machine 14, walking beam conveyor 60 remains in its lowered position for approximately two minutes during each three minute cycle to permit completion of each of the electrocoating processes. The upward movement and forward movement of walking beam conveyor 60 is accomplished fairly rapidly. Therefore, each part 20 spends approximately 39 minutes in the electrocoating process. The lower level also includes the pick-up/drop off station 72 and vertical transfer stations 96, 196. Each tank 90 and station 72, 96, 196 is displaced from the adjacent station by four feet, so the total length of the lower level is sixty feet (fifteen stations times four feet between stations). Heating section 36 of apparatus 14 is approximately thirty-nine feet long, so each part 20 remains in the oven section for approximately thirty-nine minutes (the time required for the completion of 13 cycles with the part 20 being moved forward in three foot increments (equal to the length of the segment bar) each cycle). Cooling section 38 is approximately twenty-one feet long, so each part 20 remains in the cooling section 38 for approximately twenty-one minutes (the time required for the completion of seven cycles with the part 20 being moved forward in three foot increments (equal to the length of the segment bar 28) each cycle). Thus curing section 32 has a total length of sixty feet, the same as the lower level.

When tracks 132 of push rod conveyor 134 are fully loaded with loadbar assemblies 22, the loading of an additional loadbar assembly 22 onto tracks 132 at loading end urges a loadbar assembly 22 off of tracks at exit end. Lowering conveyor 198 is provided at exit end of curing section 32 to transfer parts 20 between push rod conveyor 134 and walking beam conveyor 60. Lowering conveyor 198 is substantially similar to lifting conveyor 98 and will not be described in detail, rather similar reference numerals will be used for similar parts. Carriage 220 travels between a raised position and a lowered position. In the illustrated embodiment, the lateral centerlines of the horizontal arms 222, 224 of carriage 220 of lowering conveyor 198 are displaced from centerline 104 of pick-up/drop off station 72 by a distance equal to each of the centerline displacements 118 of adjacent pairs of saddles 58, the horizontal range of motion of inner frame 102 with respect to outer frame 100, and the centerline displacements 94 between adjacent tanks 90 and stations 72, 96, 196.

When the carriage 220 is in its upper position at curing compartment unload location 199, carriage 220 is positioned so that a loadbar assembly 22 can be urged off of tracks 132 of the push rod conveyor 134 onto horizontal arms 222, 224 of carriage 220. When in the lowered position or lowering conveyor station 196, the first set of saddles 58 of walking beam conveyor 60 passes between the flanges 226, 228 of lowering conveyor 198 to lift finished part 20 from lowering conveyor 198. Lowering conveyor 198 subsequently returns to the raised position to await receipt of the next part 20 completing the curing process.

After walking beam conveyor 60 has reached the upper position and lifted finished part 20 from lowering conveyor 198, inner frame 102 of walking beam conveyor 60 is indexed forward. After inner frame 102 of walking beam conveyor 60 is indexed forward, finished part 20 is centered over centerline 104 of pick-up/drop-off station 72. During the next downward movement of walking bar conveyor 60, finished part 20 is deposited in V-shaped loadbar receiver 82 of vertical telescoping member 80 of transfer cart 62. Finished part 20 is subsequently returned by transfer cart 62 to overhead monorail conveyor 12 after walking beam conveyor 60 has come to rest in the lowered position. This transfer is accomplished by a counter-clockwise rotation of chain 68 inducing transfer cart 62 to move to monorail load/unload position 70. Chain 68 continues its counter-clockwise rotation causing perch 91 to round upper left sprocket 86 permitting telescoping member 80 to lower and to deposit loadbar assembly 22 in loadbar receiver 24 of monorail conveyor 12.

Those skilled in the art will recognize certain advantages to the described transfer system 10. The transfer of parts 20 is accomplished within the machine 14 without complex mechanisms for the interface between different conveyors. Also, by fixedly attaching the segment bars 28 to the loadbar assembly 22, no equipment is required to provide spacers for proper incremental movement of parts 20 through push rod conveyor 134. Also, loadbar assemblies 22 are heated only once while in the heating section 36 and cooled once in the cooling section 38. Push rod conveyor 134 contains no moving parts other than load bar assemblies 22 and rollers that are exposed to the temperature of the oven 35, thereby reducing maintenance costs.

While described in conjunction with an electrocoating apparatus 14 having a lower thirteen tank station electrocoating process and an upper curing process, it is within the teaching of the disclosure to use the transfer system 10 in conjunction with other multi-stage processes requiring movement through various stations at different incremental rates. Those skilled in the art will recognize that more or fewer electrocoating processes could be carried out on a part 20 conveyed by the transfer system 10, and longer or shorter curing times could be accomplished by adjusting length 40 of segment bars 28 of loadbar assembly 22. While certain dimensions and shapes of components are described, those skilled in the art will recognize that components having different shapes and sizes are within the teaching of the disclosure. Also specific types of actuators, e.g. hydraulic, are described which do not limit the scope of the disclosure as other types of actuators, e.g. pneumatic, electric, may be provided.

Although the invention has been described in detail with reference to a preferred embodiment, variations and modifications exist within the scope and spirit of the invention as described and defined in the following claims.

What is claimed is:

1. A coating and curing system for coating and curing a plurality of substrates, the system comprising:

a series of processing stations spaced along a path to coat substrates in a coating section;

a curing section to cure a coating on the substrates, said curing section being vertically displaced from said coating section;

a walking beam conveyor for transferring substrates between processing stations of the coating section, said walking beam conveyor being configured for horizontal and vertical movement of the substrates;

a push bar conveyor for transferring parts through the curing section;

a plurality of loadbar assemblies, each one of said plurality of load bar assemblies being associated with a different one of the plurality of substrates, each load bar assembly having a load bar configured to cooperate with the walking beam conveyor to facilitate transfer of the loadbar and its associated substrate through the coating section and a segment bar attached to the loadbar, the segment bar having a length influencing incremental movement of the substrate through the push bar conveyor;

wherein the walking beam conveyor is configured to horizontally move substrates attached to loadbar assemblies a first incremental distance between adjacent processing stations during each cycle of the system and wherein the push bar conveyor horizontally moves substrates attached to loadbar assemblies a second incremental distance through the curing section during each cycle of the system.

2. The system of claim 1 and further comprising a lifting conveyor for transferring substrates between the coating section and the curing section.

3. The system of claim 1 wherein the walking beam conveyor includes a plurality of saddles each configured to receive a loadbar assembly.

4. The system of claim 3 wherein adjacent saddles are displaced from one another by a distance equal to the distance the processing stations are spaced along the path.

5. The system of claim 1 wherein the curing section comprises a heating section and a cool down section.

6. The system of claim 1 wherein the curing section is located vertically above the coating section.

7. The system of claim 6 wherein the footprint of the curing section is within the footprint of the coating section.

8. The system of claim 1 wherein the segment bar is permanently attached to the loadbar.

9. The system of claim 1 wherein the walking beam conveyor includes an outer frame for vertical movement and an inner frame coupled to the outer frame for longitudinal movement along the path relative to the outer frame.

10. The system of claim 9 wherein the inner frame has a longitudinal range of movement relative to the outer frame equal to the distance the processing stations are spaced along the path.

11. The system of claim 4 wherein the saddles are configured to permit upward vertical movement of the loadbar with respect to the saddle.

12. The system of claim 11 further comprising a lifting conveyor for transferring substrates between the coating section and the curing section.

13. The system of claim 12 wherein the walking beam conveyor and lifting conveyor cooperate to move the loadbar assembly vertically upwardly with respect to the walking beam conveyor during transfer of the loadbar assembly and its associate substrate from the walking beam conveyor to the lifting conveyor.

14. The system of claim 13 wherein the lifting conveyor includes a horizontally extending rigid arm upon which a load bar assembly is carried.

15. The system of claim 14 wherein following transfer of a substrate to the curing section, the load bar assembly associated with the substrate is urged to move horizontally from the horizontally rigid arm of the lifting conveyor into the push rod conveyor.

16. The system of claim 15 wherein the segment bar is fixedly attached to the loadbar.

17. The system of claim 16 wherein the second incremental distance is equal to the length of the segment bar.

18. The system of claim 17 wherein the first and second incremental distances are not equal.

19. The system of claim 18 further comprising a lowering conveyor for transferring substrates vertically between the curing section and the coating section.

20. The system of claim 19 wherein the lowering conveyor includes a horizontally extending rigid arm, a loadbar assembly attached to a substrate horizontally exiting the push rod conveyor is supported by the horizontally rigid arm during transfer of the substrate to the walking beam conveyor.

21. The system of claim 1 wherein the loadbar assembly includes a segment bar attached to each end of the loadbar.

22. The system of claim 1 wherein the push bar conveyor includes a track within which a segment bar of a loadbar assembly is slidably received.

23. The system of claim 22 wherein the push bar conveyor includes a hydraulic cylinder with a piston rod having a range of motion influencing the second incremental distance.

24. The system of claim 23 further comprising a lifting conveyor for transferring substrates between the coating section and the curing section and wherein the push bar conveyor piston rod is configured to urge a loadbar from the lifting conveyor into the track.

25. The system of claim 24 wherein a loadbar assembly urged from the lifting conveyor engages an adjacent loadbar assembly positioned in the track.

26. The system of claim 25 further comprising a lowering conveyor for receiving a loadbar assembly leaving the track of the push bar conveyor.

27. The system of claim 26 wherein the lowering conveyor is configured to move vertically between an upper position and a lower position.

28. The system of claim 27 wherein the lowering conveyor transfers substrates between the curing section and the coating section.

29. The system of claim 28 wherein the lowering conveyor is positioned to transfer a loadbar assembly to a saddle of the walking beam conveyor during movement between the upper position and lower position.

30. The system of claim 21 wherein the push bar conveyor includes two tracks spaced apart for receipt of both segment bars of a loadbar assembly.

31. The system of claim 30 wherein the tracks of the push bar conveyor have a length equal to an integral multiple of the length of the segment bars of the loadbar assembly.

32. The system of claim 1 wherein each loadbar assembly received in the push rod conveyor remains in engagement with an adjacent loadbar assembly received in the push rod conveyor until expelled from the push rod conveyor.

33. The system of claim 32 wherein each loadbar assembly received in the push rod conveyor remains in engagement with adjacent loadbar assemblies received in the push rod conveyor.

34. The system of claim 31 wherein the tracks of the push rod conveyor are filled with loadbar assemblies when the loadbar assemblies have been urged into the tracks.

35. The system of claim 34 wherein urging a loadbar assembly into the filled tracks at a first end urges a loadbar assembly from the tracks at the opposite end.

36. The system of claim 35 wherein the push bar assembly extends through heating and cooling sections of the curing section.

37. The system of claim 36 wherein the only moving components in the heating section are loadbar assemblies and rollers coupled to the tracks of the push rod assembly upon which the loadbar assemblies are supported.

* * * * *